(12) United States Patent
Szyperski et al.

(10) Patent No.: US 7,408,346 B2
(45) Date of Patent: Aug. 5, 2008

(54) SIMULTANEOUS PHASE CYCLING FOR NUCLEAR MAGNETIC RESONANCE SPECTROSCOPY

(75) Inventors: Thomas A. Szyperski, Amherst, NY (US); David M. Parish, Buffalo, NY (US)

(73) Assignee: The Research Foundation of the State University of New York, Amherst, NY (US)

( * ) Notice: Subject to any disclaimer, the term of this patent is extended or adjusted under 35 U.S.C. 154(b) by 0 days.

(21) Appl. No.: 11/474,249

(22) Filed: Jun. 23, 2006

(65) Prior Publication Data

US 2007/0007959 A1 Jan. 11, 2007

Related U.S. Application Data

(60) Provisional application No. 60/693,275, filed on Jun. 23, 2005.

(51) Int. Cl.
*G01V 3/00* (2006.01)
(52) U.S. Cl. .................................................. 324/307
(58) Field of Classification Search .................. 324/307
See application file for complete search history.

(56) References Cited

U.S. PATENT DOCUMENTS 4,760,338 A * 7/1988 Kose et al. .................. 324/309
6,828,790 B2 * 12/2004 Katscher et al. ............. 324/318
6,873,153 B2 3/2005 Frydman

OTHER PUBLICATIONS

Frydman et al., "The Aquisition of Multidimensional NMR Spectra Within a Single Scan," PNAS, 99 (25):15858-15862 (2002).
Frydman et al.; "Principles and Features of Single-Scan Two-Dimensional NMR Spectroscopy," J.Am.Chem.Soc., 125(30):9204-9217 (2003).
Bhattacharyya and Kumar, "A fast method for the measurement of long spin-lattice relaxation times by single scan inversion recovery experiment," Chemical Physics Letters, 383:99-103 (2004).
Cano et al., "Cascaded z-filters for efficient single-scan suppression of zero-quantum coherence," J. Magn. Reson., 167:291-297 (2004).
Loening et al., "Single-scan longitudinal relaxation measurements in high resolution NMR spectroscopy," J. Magn. Reson., 164:321-328 (2003).
Thrippleton and Keeler, "Elimination of Zero-Quantum Interference in Two-Dimensional NMR Spectra," Angew. Chem. 115:4068-4071 (2003).

* cited by examiner

*Primary Examiner*—Brij B Shrivastav
*Assistant Examiner*—Megann E Vaughn
(74) *Attorney, Agent, or Firm*—Nixon Peabody LLP

(57) ABSTRACT

The present invention discloses a method of simultaneously conducting more than one step of a radiofrequency phase cycle in a nuclear magnetic resonance (NMR) experiment. The method first involves providing a sample. Next, one or more radiofrequency pulses are applied to a plurality of spatially discrete slices of the sample under conditions effective to simultaneously conduct more than one step of a radiofrequency phase cycle in a single transient. Then, NMR signals generated from the step of applying the radiofrequency pulses are acquired. Finally, the NMR signals are processed to obtain an NMR spectrum.

15 Claims, 19 Drawing Sheets

Figures 6 A-B

A
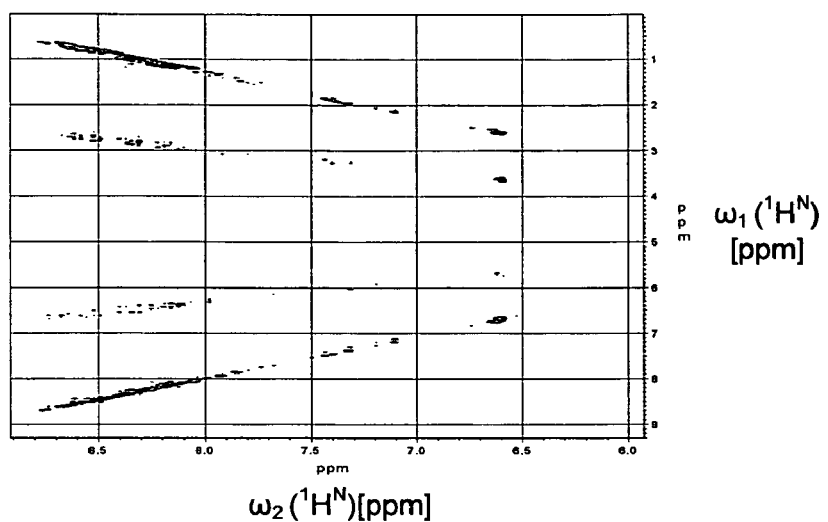
$\omega_1\,(^1H^N)$ [ppm]
$\omega_2\,(^1H^N)$ [ppm]
B
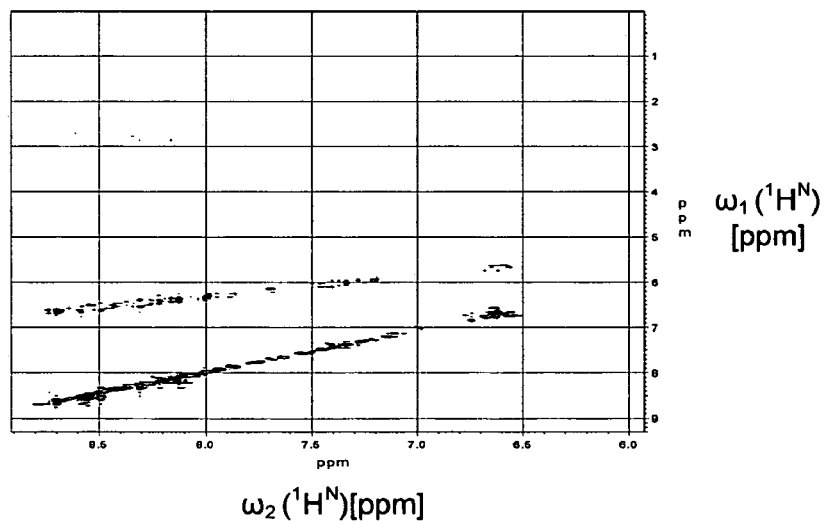
$\omega_1\,(^1H^N)$ [ppm]
$\omega_2\,(^1H^N)$ [ppm]
Figures 10 A-B A
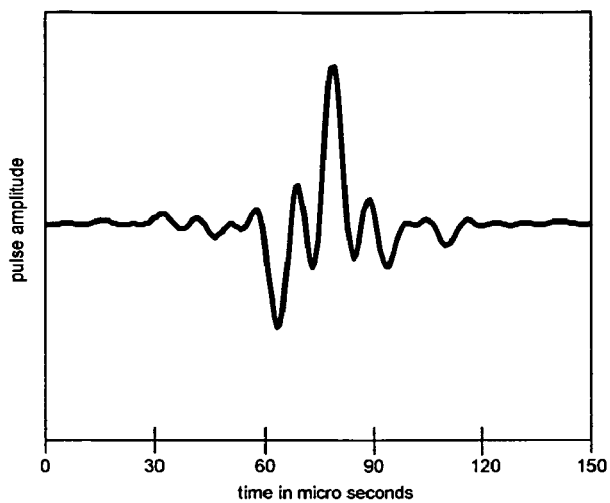
B
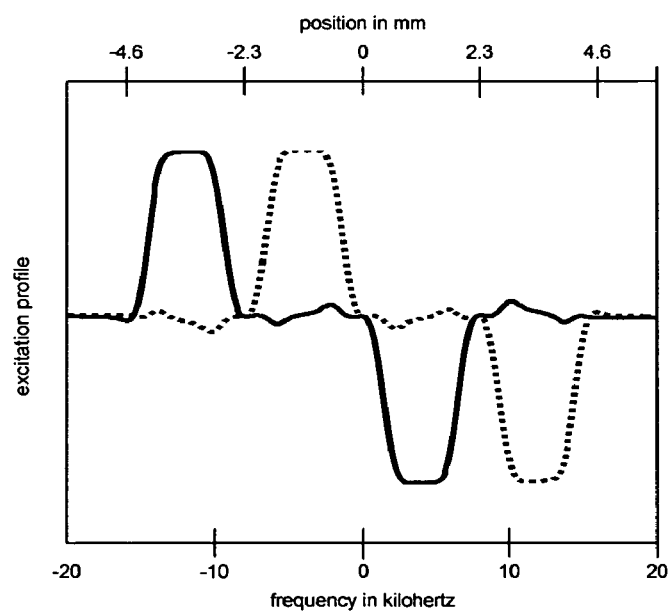
Figures 15 A-B

SIMULTANEOUS PHASE CYCLING FOR NUCLEAR MAGNETIC RESONANCE SPECTROSCOPY

This application claims the benefit of U.S. Provisional Patent Application Ser. No. 60/693,275, filed Jun. 23, 2005, which is hereby incorporated by reference in its entirety.

This invention arose out of research sponsored by the National Science Foundation (Grant Nos. MCB 0416899 and MCB 0075773). The U.S. Government may have certain rights in this invention.

FIELD OF THE INVENTION

The present invention relates to methods of simultaneously conducting more than one step of a radiofrequency phase cycle in a nuclear magnetic resonance experiment.

BACKGROUND OF THE INVENTION

Nuclear Magnetic Resonance Phenomenon

Atomic nuclei possessing a spin quantum number larger than zero have a non-classical angular momentum called "nuclear spin." Since the nuclei are charged, the nuclear spin creates a nuclear magnetic moment. In the presence of an external magnetic field, a slight majority of these magnetic moments are aligned parallel with the field. This "excess population" of aligned spins or "polarization" is the target for nuclear magnetic resonance (NMR) experiments.

A radio frequency (RF) pulse at exactly the right frequency causes a coherent precession of spin magnetic moments (a "coherence") about the external magnetic field axis (also called the "longitudinal axis"). The angle that the RF pulse tips the net magnetic moment of the spins away from the longitudinal axis is called the "flip angle" and is usually 90° in an "excitation pulse" or 180° in an "inversion pulse." If the net magnetic moment has been rotated 90° from the longitudinal axis, it is said to be "transverse." RF pulses also have a phase associated with them (usually 0°, 90°, 180°, or 270°), which determines which direction the net magnetic moment will be pointing once it reaches the transverse plane.

The precessing magnetic moments produce a free induction decay (FID) signal that can be detected with an RF coil and an RF receiver. The experimental power of NMR lies in the extraordinarily high "Q" (the ratio of stored to dissipated energy per cycle in a dynamic system) in a precessing population of spin ½ magnetic moments due to their weak interaction with the environment. The resulting narrow linewidth allows accurate spatial separation in magnetic resonance imaging and precise measurement of chemical shifts in high resolution NMR spectroscopy.

Magnetic Resonance Imaging and Spatial Selectivity

The NMR phenomenon is exploited in a medical imaging modality called magnetic resonance imaging (MRI). In this technique, a part of the (human) body is placed in a large (usually superconducting) magnet. RF transmission and reception is used to excite and receive NMR signals from $^1$H nuclei in the body (primarily those present in water). The relaxation rates of the detected signals vary with the type of tissue the nuclei are embedded in. Special techniques are used to localize the RF signals in space and the result is a detailed anatomical picture of the imaged region. Current MRI images depict planes of tissue only a few millimeters thick and have in-plane resolution of less than a millimeter.

A key tool for signal localization in MRI is a set of 3-axis "pulsed magnetic field gradients." These gradients can be rapidly switched on and off and produce a variation in the magnetic field strength that is linear in a certain direction (usually labeled as x, y, and z). During the application of a gradient, the resonance frequency of the NMR signal is, thus, a linear function of the position along the axis of that gradient. In MRI, these gradients are applied in different ways to achieve spatial localization in each of the three spatial dimensions (Mansfield et al., *NMR Imaging in Biomedicine* Academic Press, San Diego (1982)).

In the first dimension (which can be an arbitrary plane in three dimension), spatial localization is achieved during RF excitation. A linear pulsed field gradient known as the "slice select gradient" is applied simultaneously with the application of the RF excitation pulse as shown in FIG. 1. The "temporal" shape of the pulse defines the "excitation profile" in the frequency domain. The effect of the linear field gradient is to map the frequency domain "excitation profile" into position in space along the gradient, creating a "spatial profile." The result is that the "spatial excitation profile" is to first order the Fourier transform of the temporal RF pulse shape. Usually a (sin(t)/t) or "sinc" shaped RF pulse is used, which results in excitation of a narrow planar slice of the body, since the Fourier transform of (sin(t)/t) is a rectangle. The excitation gradient is applied during the duration of the shaped RF pulse. Since the gradient shifts the resonance frequency of the spins proportionally to their position in the gradient, the RF pulse is "off-resonance" or not quite at the correct frequency for all spins except those in the exact center of the gradient. An off-resonance RF pulse leads to a phase shift proportional to the frequency offset. This shift can be approximated by assuming an on-resonance pulse followed by an evolution period of duration, $$tau = 2*(\text{pulse width})/pi$$

during which time phase evolves due to the frequency offset (Cavanagh et al., *Protein NMR Spectroscopy*, Academic Press, San Diego (1996)). The frequency offset of each spin is proportional to its position in the selection gradient direction. Therefore, the phase shift resulting from the selective excitation is also proportional to position. The result is a linear phase shift in the direction of the gradient. This shift can be removed by reversing the gradient for the period tau, during which transverse magnetization is present (FIG. 1).

Once a thin plane of material has been excited, the radio receiver is turned on and RF signals from the precessing spins are detected with a receiver. During this period, a linear magnetic field gradient known as the "readout" or "frequency encoding" gradient is applied in a direction orthogonal to the slice select gradient. The signal frequency of each spin is proportional to its localized magnetic field strength and, thus, is proportional to its position in the gradient direction (i.e., X). A Fourier transform of the received time domain signals then separates the signals by position in the readout gradient direction (FIG. 2). The implementation of the readout gradient is shown in FIG. 3. After excitation, the phase of the signal from each part of the sample is the same. A "readout dephase" gradient pulse imparts a phase shift as a function of position. The readout gradient then causes frequency encoding which acts to rephase the phase shift. In the middle of the acquisition window, the signal peaks because signals from the entire sample are instantaneously in-phase.

The same method is used to localize in the final, third dimension. In this case, rather than apply a continuous gradient pulse as in the readout direction, a short gradient pulse known as the "phase encoding" gradient is applied in the third direction in the time between RF excitation and reception.

The entire experiment is repeated many times with the phase encoding gradient strength (amplitude times duration) incremented linearly as a function of experiment number. The net result is again that a Fourier transform of the received time domain signals, this time in the direction associated with repeated experiments, results in localization in the third direction. Simultaneous application of all three of these techniques provides a detailed two-dimensional (2D) picture of a thin slice of tissue. FIG. 4 shows a schematic of the basic spatial encoding scheme used in MRI.

A slight modification of the technique described above, which allows acquisition of an entire 2D slice in a single experiment, is called "echo planar imaging." In this technique, the readout gradient is stronger, thereby compressing the spatial encoding of the second direction in time. During each gradient pulse, the transverse magnetization across the sample is gradually rephased, producing a signal peak or "gradient echo." Fourier transform of the gradient echo produces a spatial profile of the signal in the gradient direction. The gradient is then reversed and rephased again from the opposite direction. Thus, a "square wave oscillating" gradient will generate a train of gradient recalled echoes in the center of each gradient pulse. The phase encoding gradient can then be applied in short pulses between these echoes, allowing acquisition of an entire 2D image in a single transient. FIG. 5 shows a schematic of the spatial encoding scheme for echo planar MRI.

High Resolution Nuclear Magnetic Resonance Spectroscopy

Like MRI, high resolution NMR relies on the phenomenon of magnetic resonance in order to obtain spectral information from NMR active (usually spin ½) atomic nuclei. However, in the case of conventional high resolution NMR, signals are not spatially resolved. Instead, experiments are employed that gather detailed information about the localized chemical environment of the nuclei in a molecule, as well as the spatial interaction of their magnetic moments. High resolution NMR is conducted on samples in solution and each atomic nucleus in the molecule resonates at a slightly different frequency or "chemical shift." The chemical shift provides information about the molecular environment of the atom and allows, in conjunction with their mutual coupling, one to assign signals to specific nuclei.

NMR active nuclei that are covalently bonded in a molecule interact by a mechanism known as "scalar coupling" in which one nucleus causes a frequency shift (+ or −½ of the scalar coupling constant depending on the spin state of the atom) to the NMR frequency of the other nucleus. Scalar coupling can be exploited to transfer polarization from one nucleus to the next. Polarization can be transferred to the same type of atom (i.e., $^1$H to $^1$H) in a "homonuclear" NMR experiment or to another type of atom (i.e., $^1$H to $^{15}$N) in a "heteronuclear" NMR experiment.

A pulse sequence module known as "insensitive nuclei enhanced by polarization transfer" or INEPT is used to transfer polarization from an NMR sensitive spin such as $^1$H to a less sensitive spin such as $^{15}$N. "Multidimensional heteronuclear NMR" studies use this module repeatedly to sequentially transfer polarization. The experiment is repeated with different time delays or "chemical shift evolution periods" in order to gather chemical shift information on each of the involved spins. RF pulse sequences have been designed that exploit the known covalent structure of proteins and provide chemical shifts for hydrogens, carbons, and nitrogens in proteins that have been labeled with the spin ½ isotopes $^{13}$C and $^{15}$N. The chemical shifts can be combined with signals from another type of study that produces signals from pairs of protons that are close in space to solve the three dimensional structure of biological macromolecules.

NMR RF pulse sequences often rely on "RF pulse phase cycling" to suppress artifacts, to detect signals in indirect dimensions in a phase-sensitive manner ("quadrature detection"), to select desired coherence transfer pathways as in double quantum filtered (DQF) correlation spectroscopy (COSY), and/or to edit signals into sub-spectra of a G-matrix Fourier transform (GFT) NMR experiment. Phase cycling consists of repeating the same sequence of RF pulses two or more times while changing the phase(s) of one or more RF pulses and/or the receiver phase (Ernst et al., *Principles of Nuclear Magnetic Resonance in One and Two Dimensions*, Clarendon, Oxford (1987)).

Historically, NMR experiments are repeated many times so that "signal averaging" can be used to increase the signal to noise ratio. If such signal averaging is required to achieve a sufficiently high signal-to-noise ratio, an NMR experiment is considered "sensitivity limited" (Szyperski et al., "Reduced-Dimensionality NMR Spectroscopy for High-Throughput Protein resonance Assignment," *Proc. Natl. Acad. Sci. USA* 99:8009-8014 (2002)). The desire to obtain complete chemical shift assignments for protein amino acid residues has led to the development of two-, three-, and even four-dimensional NMR experiments requiring the acquisition of hundreds or even thousands of free induction decays (FIDs) in order to sample the indirect chemical shift evolution periods. When using a highly sensitive NMR spectroscopic set-up, this may lead to the situation where NMR time is solely invested to sample indirect dimensions and not for achieving a sufficient signal-to-noise ratio. This data acquisition regime is named the "sampling limited regime" (Szyperski et al., "Reduced-Dimensionality NMR Spectroscopy for High-Throughput Protein Resonance Assignment," *Proc. Natl. Acad. Sci. USA* 99:8009-8014 (2002)).

Several approaches have been developed to decrease data collection time while still obtaining high-dimensional NMR spectral information. GFT NMR spectroscopy (Kim et al., "GFT NMR, A New Approach to Rapidly Obtain Precise High-Dimensional NMR Spectral Information," *J Am. Chem. Soc.* 125:1385-1393 (2003); Atreya et al., "G-matrix Fourier Transform NMR Spectroscopy for Complete Protein Resonance Assignment," *Proc. Natl. Acad. Sci. U.S.A.* 101:9642-9647 (2004)) allows projection of multi-dimensional NMR spectra into fewer dimensional space with associated time savings. In another vein, Frydman et al. have adapted spatially selective excitation from MRI to simultaneously conduct multiple time increments of indirect dimensions of a multidimensional NMR experiment on a sample by dividing the sample into discrete spatial slices (Frydman et al. "Principles and Features of Single-Scan Two-Dimensional NMR Spectroscopy," *J Am. Chem. Soc.* 125:9204-9217 (2003); U.S. Pat. No. 6,873,153 to Frydman).

As mentioned above, the combination of higher dimensional studies which require a number of transients to get usable resolution in each dimension, along with improvements in equipment sensitivity, higher field strength magnets and cryogenic probes, has lead to a point where the duration of the data acquisition is determined by sampling needs rather than intrinsic signal to noise limitations. Development of methods for shortening this duration while retaining the required NMR spectral information is an active area of research. Reduced dimensionality and GFT NMR spectroscopy (Szyperski et al., "GFT NMR, A New Approach to Rapidly Obtain Precise High-Dimensional NMR Spectral Information," *J Am. Chem. Soc.* 125:1385-1393 (2003)), sparse sampling of NMR data, and Frydman's spatial-temporal approach (Frydman et al., "The Acquisition of Multi-dimensional NMR Spectra Within a Single Scan," *Proc. Natl. Acad. Sci. U.S.A.* 99:15858 (2002)) each address this problem in different ways. Nonetheless, a large need for tools allowing one to reduce the minimal measurement times of multidimensional NMR experiments remains.

The present invention is directed to achieving this objective.

SUMMARY OF THE INVENTION

The present invention relates to a method of simultaneously conducting more than one step of a radiofrequency phase cycle in a nuclear magnetic resonance (NMR) experiment. The method first involves providing a sample. Next, one or more radiofrequency pulses are applied to a plurality of spatially discrete slices of the sample under conditions effective to simultaneously conduct more than one step of a radiofrequency phase cycle in a single transient. Then, NMR signals generated from the step of applying the radiofrequency pulses are acquired. Finally, the NMR signals are processed to obtain an NMR spectrum.

The present invention uses spatial selection and localization techniques from the art of MRI in conjunction with phase cycle schemes from the art of NMR spectroscopy. Composite RF pulses are used to simultaneously excite multiple slices within the sample, in contrast to Frydman's approach (Frydman et al., "The Acquisition of Multidimensional NMR Spectra Within a Single Scan," *Proc. Natl. Acad. Sci. U.S.A.* 99:15858 (2002), which is hereby incorporated by reference in its entirety) where multiple slices are excited sequentially in time. The RF pulse shape is such that, after excitation, the transverse magnetization of each excited slice will have an independent phase. This allows one to simultaneously conduct multiple phase cycles in one experiment. Conventionally, these experiments would be conducted sequentially in time with multiple repetitions of the entire experiment and different excitation phases on one or more RF pulses. Thus, the present invention allows the same information to be collected in less time, allowing researchers avoid sampling limited data collection.

While the challenge is that the signals from these experiments would completely superimpose upon each other in a conventional data acquisition, separation of the signals from each of the discrete slices is achieved by applying a pulsed magnetic field gradient during acquisition and performing a Fourier transform on the acquired "gradient echo" to resolve the signals in space. The gradient is repeatedly reversed during the desired acquisition period so as to produce an evenly spaced train of gradient echoes. Each gradient echo is Fourier transformed to separate the signal into that for each of the excited slices at a single acquisition time point. Repartitioning the signals for the train of gradient echoes then provides independent FID signals for each of the excited slices. The equivalent of receiver phase shifts is applied mathematically during processing.

BRIEF DESCRIPTION OF THE DRAWINGS

FIG. 6A shows the slice profile of a simulated four slice excitation with phases of 0°, 90°, 180°, 270°. The solid and dotted lines represent the real and the imaginary part of the profile. FIG. 6B shows the temporal shape of the real part of the corresponding RF pulse. Because this pulse is hermitian in frequency domain, the imaginary part of the temporal shape is 0.

FIGS. 10A-B demonstrate the use of simultaneous phase cycling for quadrature detection of chemical shift using the pulse sequence of FIG. 9. The 2D spectrum was acquired for a $^{15}$N, $^{13}$C-labeled polypeptide. The spectrum corresponding to the region of the sample that received a 0° RF pulse is shown in FIG. 10A. The strong diagonal peaks are at $\omega_1(^{1}H^{N})$ and $\omega_2(^{1}H^{N})$, and discrimination between positive and negative frequencies in the vertical direction is not possible due to the lack of quadrature detection. The weak peaks halfway between the diagonal and centerline were an undetermined artifact that was also present in the conventional version of the pulse sequence. The simultaneous phase-sensitively detected spectrum is shown in FIG. 10B. The spectra corresponding to excitation with $^{1}$H pulses with phases 0° and 180° were combined as to provide the "real" signal for the Fourier transform in the indirect dimension. Correspondingly, the spectra corresponding to excitation with $^{1}$H pulses with phases 90° and 270° were combined to form the "imaginary" signal. The complex Fourier transform in the vertical axis now provides discrimination between positive and negative frequency offsets as evidenced by the appearance of only one diagonal signal rather than two.

FIGS. 15A-B show the composite RF pulse used for the simultaneous phase cycling DQF COSY pulse sequence. FIG. 15A shows the temporal shape of the RF pulse used for the simultaneous phase cycling DQF COSY pulse sequence. The 150 µsec long pulse is created by summing together four sin(t)/t or "sinc" shaped waveforms. Each pulse has a center lobe and two lobes on either side, giving it a time bandwidth product of about 6. The four pulses are frequency shifted to have a frequency spacing of 1.15 times their spectral width by multiplying by offset frequencies of $e^{(i*pi*-3/2*1.15*t)}$, $e^{(i*pi*-1/2*1.15*t)}$, $e^{(i*pi*1/2*1.15*t)}$ and $e^{(i*pi*3/2*1.15*t)}$. The desired phase shifts of 0°, 90°, 180°, and 270° are applied by multiplying the four "sinc" waveforms by 1.0, $e^{(i*pi/2)}$, $e^{(i*pi)}$, and $e^{(i*pi*3/2)}$, respectively. The four pulses are then added together and the composite pulse is apodized with a Hamming window (w[k+1]=0.54−0.46*cos(2πk/(n−1)), k=0, . . . n−1) to reduce "cross talk" between the slices in the frequency domain. FIG. 15B shows a simulation of the spatial excitation profile of the composite pulse, illustrating the four discrete slices with the desired phases. The total spectral width of the composite pulse is around 64 kHz which corresponds to a spatial extent of 9.2 mm when applied concurrent with a gradient of amplitude of 16 Gauss/cm.

DETAILED DESCRIPTION OF THE INVENTION

Figure 1:
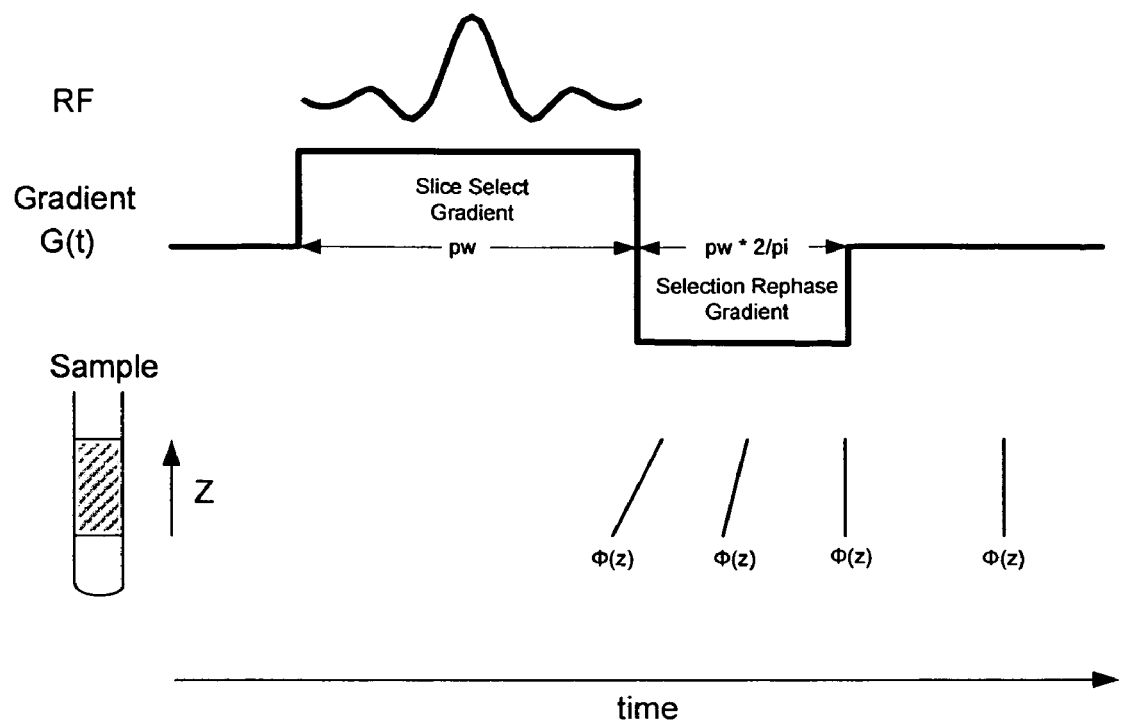
FIG. 1 is a schematic of a spatial excitation scheme used in MRI. An RF excitation pulse with a "sinc" like temporal shape and duration pw is applied in concert with a selection gradient along the Z axis. This results in excitation of a finite region of the sample (shaded area). The RF pulse is off-resonance for all spins except those in the center of the gradient. Each spin accumulates a phase shift proportional to its frequency offset which is proportional to its position along the Z axis, resulting in a phase gradient at the end of the RF pulse, Φ(z). A selection rephase gradient is applied with opposite polarity and equal amplitude to the selection gradient. After a period of pw*2/pi, the phase gradient is eliminated.
Figure 2:
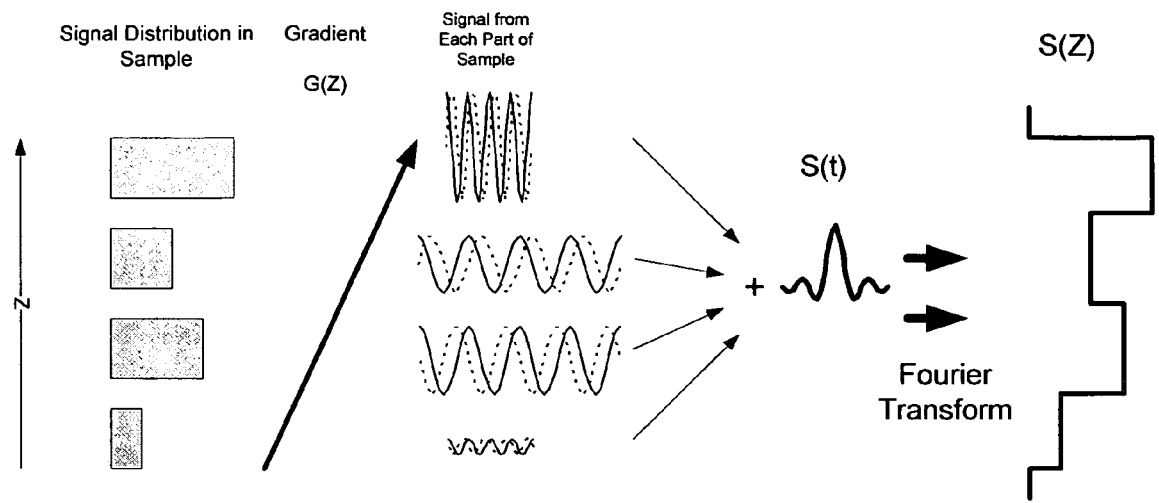
FIG. 2 illustrates the frequency encoding of spatial position used in MRI. The signal has some distribution in position due to spin density and relaxation. A gradient encodes position in one direction by frequency. Different amplitude and frequency signals from all parts of the sample contribute to make the temporal signal which is acquired. A Fourier transform of the temporal signal reveals the spatial distribution of spin signals.
Figure 3:
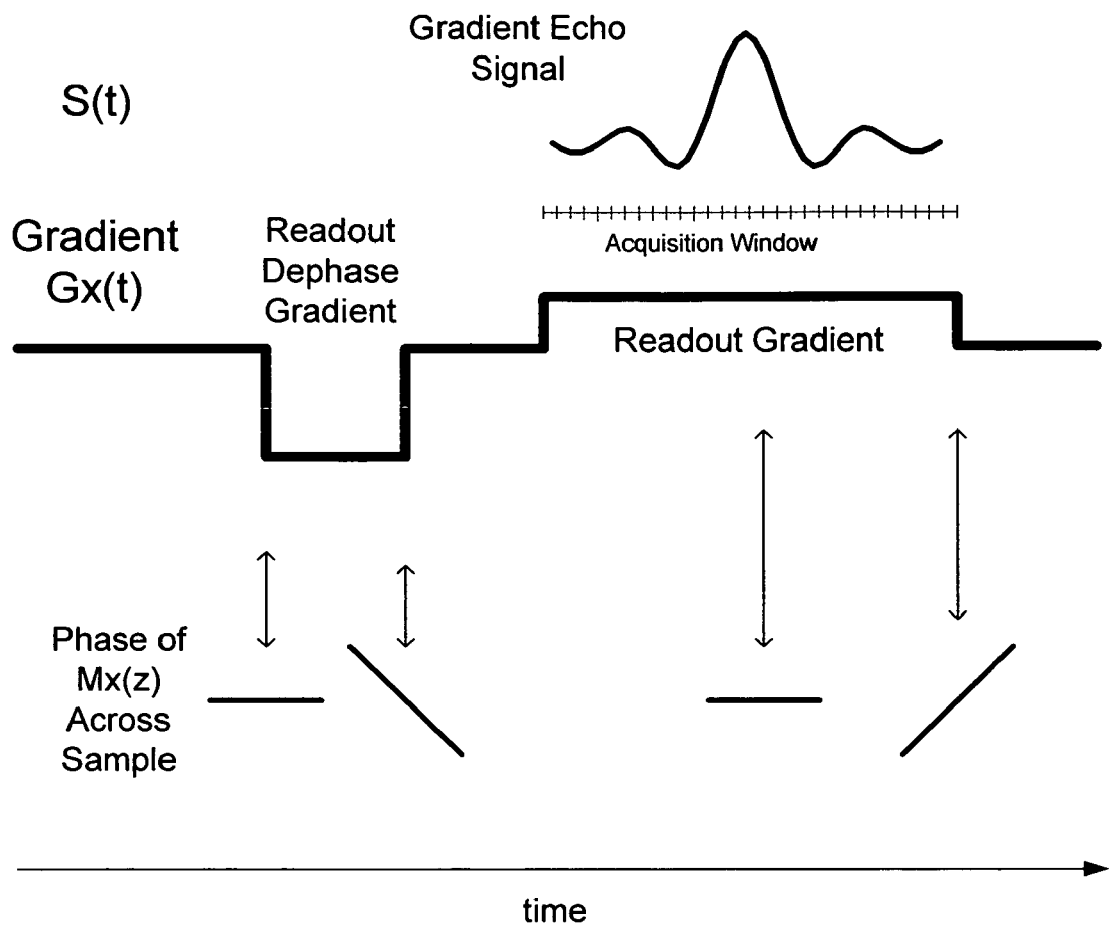
FIG. 3 shows that rephasing of frequency encoded signals makes a gradient recalled echo. After excitation, all spins have transverse magnetization and the same phase across the sample. A readout dephase gradient is used to impart a phase ramp across the sample in one direction. The opposite polarity readout gradient then rephases the phase gradient, causing a signal peak or gradient echo in the middle of the acquisition window.
Figure 4:
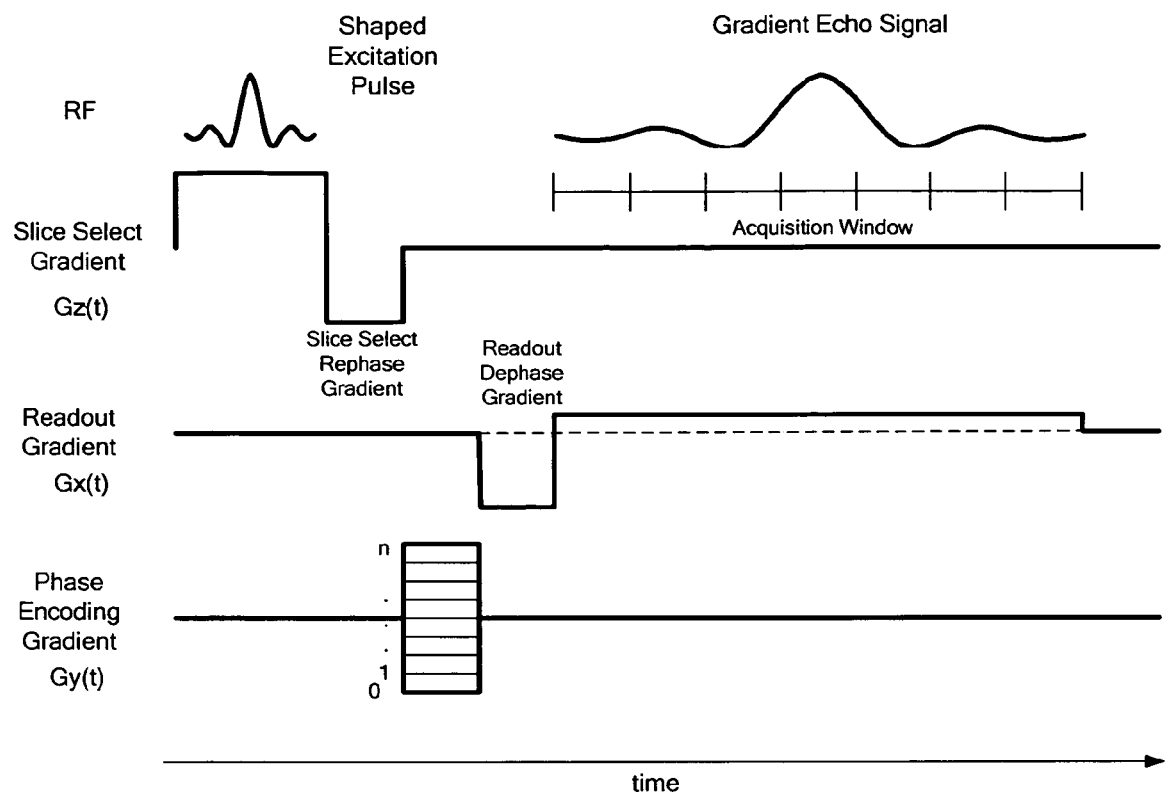
FIG. 4 shows the MRI gradient echo pulse sequence. The slice select gradient is applied during the RF excitation pulse, resulting in excitation of only a thin slice of the body or sample. The readout gradient is applied during signal acquisition and encodes position in the second direction by frequency. The phase encoding pulse is applied in between excitation and acquisition and encodes position in the third direction by phase evolution over repeated experiments. Phase encoding amplitude steps are denoted "0" up through "n" in equal increments.
Figure 5:
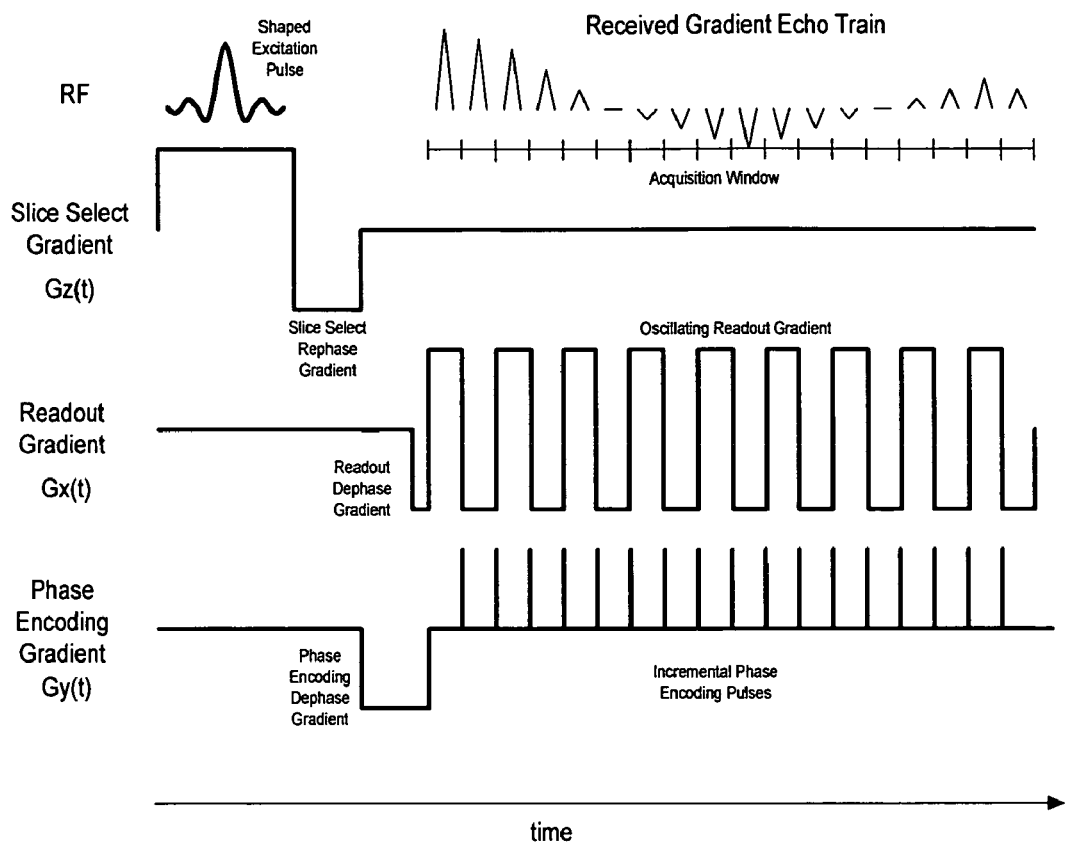
FIG. 5 shows the MRI echo planar pulse sequence. A spatially selective excitation pulse is applied along with a slice select gradient to excite a slice of the sample. A slice select rephase field gradient removes the phase gradient. A strong readout gradient is applied perpendicular to the slice select gradient to encode the position in the second direction by frequency. The readout gradient is driven with a square pulse oscillation, causing repetitive rephasing and forming a gradient echo in the middle of each acquisition window. The phase encoding gradient is applied in small increments between the gradient echoes. An entire 2-D section can be acquired in one transient.

Phase cycling is a powerful tool for spectral editing, coherence selection, and artifact suppression in NMR spectroscopy. However, execution of the phase cycle results in a corresponding lengthening of the NMR experiment. The present application discloses a technique called "simultaneous phase cycling" that uses spatially selective excitation to simultaneously conduct phase cycles by separating them into discrete spatial "slices" within the sample. An oscillating gradient is then applied during acquisition to enable dissection of the acquired signal into the separate FIDs associated with each of the excited slices. The individual FIDs are then multiplied by the required receiver phases and processed in the same manner as FIDs from conventional, sequentially executed phase cycles.

Thus, the present invention relates to a method of simultaneously conducting more than one step of a radiofrequency phase cycle in a nuclear magnetic resonance (NMR) experiment. The method first involves providing a sample. Next, one or more radiofrequency pulses are applied to a plurality of spatially discrete slices of the sample under conditions effective to simultaneously conduct more than one step of a radiofrequency phase cycle in a single transient. Then, NMR signals generated from the step of applying the radiofrequency pulses are acquired. Finally, the NMR signals are processed to obtain an NMR spectrum.

In one embodiment of the present invention, the step of applying radiofrequency pulses involves applying one or more composite radiofrequency pulses simultaneously with a pulsed magnetic field gradient to the sample under conditions effective to simultaneously excite the plurality of spatially discrete slices of the sample, where each of the plurality of spatially discrete slices is excited with an independent excitation phase. In another embodiment of the present invention, the composite radiofrequency pulse is a sum of multiple frequency shifted sinc (sin(t)/t) shaped pulses. The independent excitation phases of the composite radiofrequency pulse can be selected such that the acquired signal is a sum of signals from the plurality of spatially discrete slices of the sample. In this case, no oscillating gradient or special processing is required for acquisition of the desired signal since the signals from each of the spatially discrete slices will add together automatically and the receiver will acquire the desired summation signal.

In another embodiment of the present invention, an oscillating pulsed magnetic field gradient is applied to the sample during the acquisition of the signal under conditions effective to generate a train of gradient echoes and enable separation of signals from the plurality of spatially discrete slices of the sample. Each of the gradient echoes can be Fourier transformed to separate signals from the plurality of spatially discrete slices of the sample, each corresponding to an independent excitation phase.

RF phase cycling, which involves repeating experiments using different phases for selected RF pulses in the pulse sequence, has been used in high resolution NMR to detect signals in a phase-sensitive manner (i.e., quadrature detection). Chemical shifts for those nuclei whose signals are not directly detected during acquisition (indirect dimension chemical shifts) can be measured by using an INEPT sequence to transfer polarization to a desired nuclei for a short period of time (the delay time) and observing phase or amplitude modulation of the direct dimension signal due to this indirect dimension chemical shift. The INEPT experiment is repeated for linearly increasing delay times, so a Fourier transform in the indirect dimension then resolves the chemical shift of the associated indirect dimension nuclei. Only the real part of the phase shifted signal can be observed so this process of incremented delays cannot discriminate between positive frequency shifts and negative frequency shifts in the indirect dimension. To provide this discrimination, the entire set of experiments must be repeated twice, changing the excitation phase of one of the hetero-nuclei excitation pulses by 90 degrees to observe the imaginary component of the indirect dimension signal. The resulting complex data then allows discrimination between positive and negative chemical shifts after Fourier transform. Therefore, another aspect of the present invention relates to using the simultaneous phase cycling method of the present invention to achieve quadrature detection in the indirect dimension of a multidimensional NMR experiment in a single transient.

Another aspect of the present invention relates to using the simultaneous phase cycling method of the present invention to achieve coherence selection in a multidimensional NMR experiment in a single transient. In one embodiment, coherence selection is used for obtaining multiple-quantum filtered correlation spectrum. For example, double quantum filtered correlated spectroscopy (DQF COSY) experiments add a third RF pulse to a COSY experiment, where four step phase cycling is used to eliminate diagonal signals from uncoupled spins and to produce coupled spin diagonal and cross peaks that are in-phase. Accordingly, the method of the present invention can be useful for achieving coherence selection for such multiple-quantum filtered correlation spectrum in a single transient. In another embodiment, coherence selection is used for obtaining multiple-quantum correlation spectrum, where the multiple quantum coherence evolving in the indirect dimension is selected by the simultaneous phase cycle. In yet another embodiment, coherence selection is used for obtaining heteronuclear correlation spectrum.

Another aspect of the present invention relates to using the simultaneous phase cycling method of the present invention to obtain sub-spectra in a G-matrix Fourier transformation (GFT) NMR experiment from a single transient, where the GFT NMR experiment involves jointly sampling chemical shift evolution periods spanning a given subspace of a Fourier transformation multidimensional NMR experiment. GFT NMR spectroscopy reduces experiment time by encoding the information of higher-dimensional spectrum in fewer dimensions through co-incrementing the indirect chemical shift evolution periods. The result is that linear combinations of chemical shifts, i.e., sum and difference, are observed in one dimension rather than single quantum shifts being observed in multiple orthogonal dimensions. Heteronuclear steady state magnetization may also be added in order to provide a "central peak" reference to aid in interpreting the resultant spectra. Phase cycling is used in GFT spectroscopy to also simultaneously acquire basic and central peak sub-spectra. For example, a GFT (4,3)D HCCH experiment is acquired with a four step phase cycle (0°, 90°, 180°, 270°) on the first 90 degree proton RF pulse and two phase cycles (0°, 90°) on the first 90 degree carbon RF pulse. This combination of phase cycles allows both indirect dimension quadrature detection and use of $^{13}$C steady state magnetization to acquire central peak sub-spectra. Accordingly, the simultaneous phase cycling method of the present invention can be useful for obtaining such sub-spectra from a single transient.

Yet another aspect of the present invention relates to using the method of the present invention to suppress spectral artifacts. The spectral artifacts can arise from incomplete suppression of NMR signals of a solvent in the sample. Alternatively, the spectral artifacts can arise from NMR polarization giving rise to axial peaks.

In principle, simultaneous phase cycling can be applied to any pulse sequence that requires phase cycling. The method can be extended to more complex phase cycling schemes by designing RF pulses with more slices, and using multiple "selective" RF pulses in a pulse sequence. In general, the minimal measurement time is reduced by the number of steps that are simultaneously executed, albeit at the expense of the signal to noise ratio (SNR). SNR is reduced by the ratio of the "slice thickness" to the total sample length and further reduced due to the higher sampling bandwidths required for spatially resolved acquisition. However, in cases where equipment sensitivity and sample concentration are such that there is a surplus of SNR, simultaneous phase cycling is an attractive method for minimizing acquisition time while still selecting desired coherences.

EXAMPLES

The following examples are provided to illustrate embodiments of the present invention but are by no means intended to limit its scope.

Example 1

Use of Simultaneous Phase Cycling for Single Transient Indirect Dimension Quadrature Detection Simultaneous phase cycling was integrated into a modified [$^1$H,$^{15}$N] HSQC test pulse sequence. With this sequence, the ability to excite four slices with different phases and to separate the signals from the four slices using oscillating gradient acquisition and Fourier transform were demonstrated. These phase cycled FIDs were then used to provide quadrature information in the indirect dimension of the test sequence.

NMR Data Collection

NMR data were collected on a Varian INOVA 750 MHz and 600 MHz spectrometers (Varian, Palo Alto, Calif.) equipped with a cryogenic probe. Both spectrometers contain multiple waveform generators allowing one to apply shaped pulses on $^1$H, $^{13}$C, and $^{15}$N RF channels, and contain a pulsed field gradient (PFG) module capable of producing a linear magnetic field gradient along the $B_0$-field defining the Z axis of up to 30 Gauss/cm. The spectrometers were operated using VNMR software version 6.1 b running on a UNIX workstation. NMR data were processed and analyzed using a Linux workstation.

Samples Used for Development of NMR Methodology

A sample containing 80% $H_2O$/20% $D_2O$ in a regular 5 mm NMR tube was used for calibration of gradient strength and acquisition of high resolution slice excitation profiles for validating proper functioning of the spatial excitation module. The solution represented a cylinder of about 1 cm in length.

Samples containing approximately 100 mM $^{15}$N, $^{13}$C-labeled histidine and 100 mM $^{15}$N, $^{13}$C-labeled glutamic acid were used for the homonuclear and heteronuclear NMR studies. The spectra of these compounds contained only a few resonance lines which facilitates data interpretation.

Processing of 2D Simultaneous Phase Cycling NMR Spectrum

Data processing relied on use of the programs Matlab® (The MathWorks, Inc., Natick, Mass.) and NMRPipe (Delaglio et al., "NMRPipe: A Multidimensional Spectral Processing System Based on UNIX Pipes," *J Biomol*. NMR 6:277-293 (1995), which is hereby incorporated by reference in its entirety). Subsequent display and analysis of NMR spectra relied on using NMRDraw (Delaglio et al., "NMRPipe: A Multidimensional Spectral Processing System Based on UNIX Pipes," *J Biomol*. NMR 6:277-293 (1995), which is hereby incorporated by reference in its entirety). Some of the basic functions for data processing used for this study have already been developed in Matlab® (see Table 1).

TABLE 1

Survey of Data Analysis Routines in Matlab®

| Name | Function |
|---|---|
| vr.m | Read in VNMR fid file. |
| docentfft.m | Separate the signals from the different slices by performing a Fourier transformation on the central data points of a gradient echo. This routine also allows adjustment for small time and frequency offsets. |
| R2DStates.m | Generates a 2D NMR spectrum from FIDs and includes options for zero filling, linear prediction, and apodization. |
| makepipe.m | Write out an NMR spectrum in NMRPipe format. |

Creation of Selective RF Pulses

A library of RF pulses was generated using the program Matlab®. The basic RF pulse was a truncated "sinc" (sin(t)/t) pulse consisting of a central lobe and two side-lobes on either side. Multiple copies of the sinc pulse were multiplied by a complex sinusoid to provide a desired frequency offset, further multiplied by a fixed phase offset to provide desired phase cycling and then added together with other similarly generated pulses to create simultaneous phase cycling excitation pulses, (Table 2). These pulses were written out in VNMR format for use on a Varian NMR spectroscopy machine with a waveform generator on the RF channel of interest.

TABLE 2

Selective Excitation Pulses for Simultaneous Phase Cycling

| Pulse Name | # of Slices | Slice Spacing | Slice Phases |
|---|---|---|---|
| ssinc_s1_l3_s0.0_ph0.RF | 1 | 0 | 0 |
| ssinc_s4_l3_s1.2_ph0.RF | 4 | 1.2 × width | 0, 0, 0, 0 |
| ssinc_s4_l3_s1.2_ph90.RF | 4 | 1.2 × width | 0, 90, 180, 270 |
| ssinc_s4_l3_s1.5_ph0.RF | 4 | 1.5 × width | 0, 0, 0, 0 |
| ssinc_s4_l3_s1.5_ph90.RF | 4 | 1.5 × width | 0, 90, 180, 270 |

Figure 6:
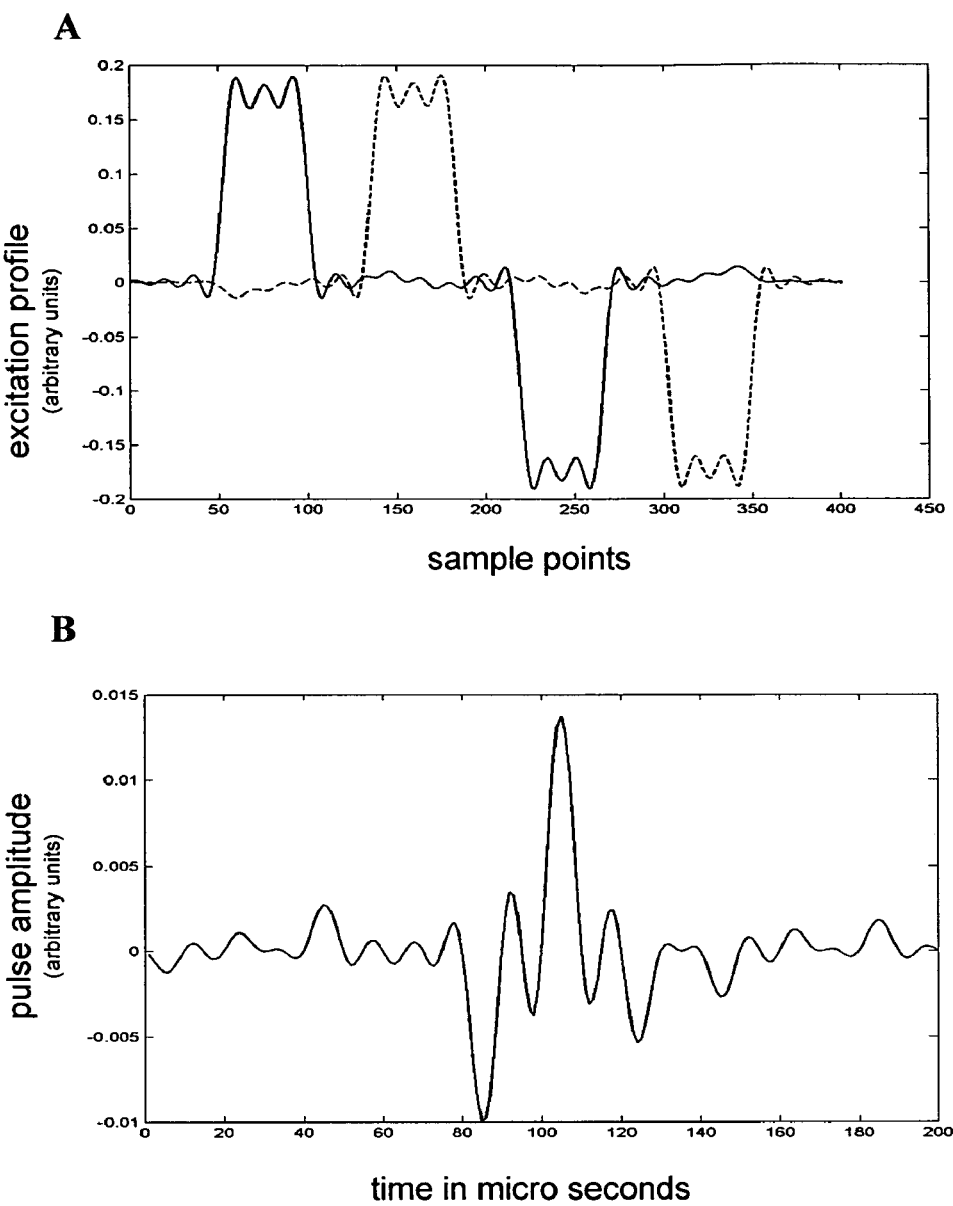
FIGS. 6A-B show the spatial excitation profile and temporal pulse shape of the ssinc_s4_l3_sl.2_ph90.RF pulse from Table 2.

FIGS. 6A-B show the spatial excitation profile and temporal pulse shape of the ssinc_s4_l3_s1.2_ph90.RF pulse in Table 1.

Spatial Excitation Module for VNMR Pulse Sequences

Figure 7:
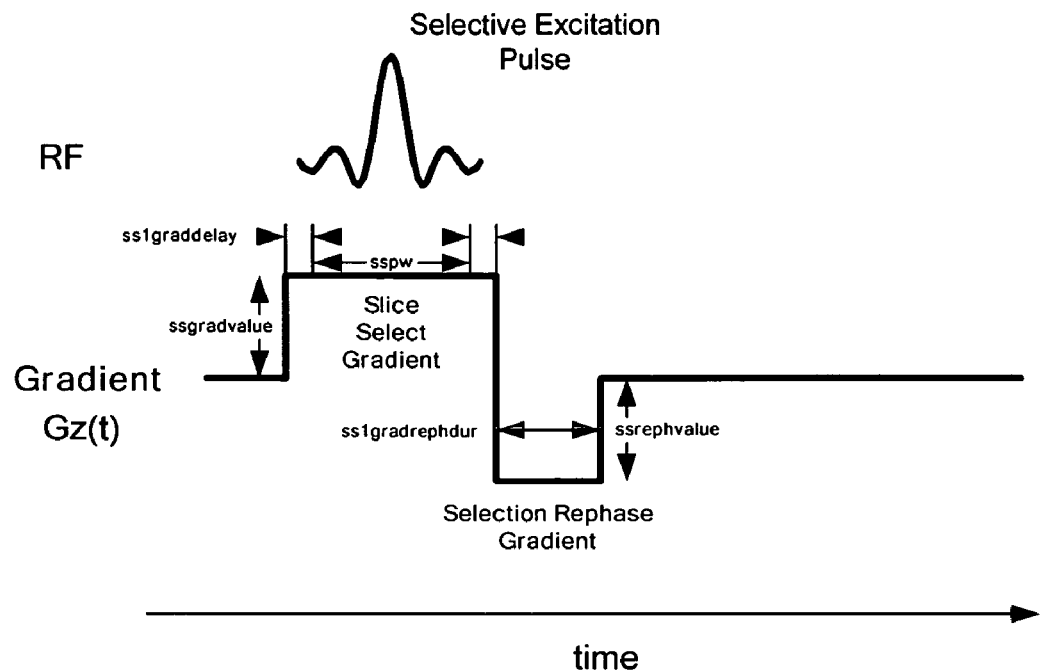
FIG. 7 depicts the selective excitation module used in the present invention. The pulse width (sspw) and the shape of the RF pulse determine the overall spectral width and, thus, the spatial profile of the excitation pulse (e.g., FIG. 6). The gradient amplitude (ssgradvalue) then determines the spatial extent of the selected region. An adjustable delay (sslgraddelay) allows for settling of the gradient prior to the RF pulse. The strength (area) of the rephase gradient (sslgradrephdur*ssrephvalue) equals 2/pi times the strength of the slice select gradient (sspw*ssgradvalue) plus the strength during the delay (sslgraddelay*ssgradvalue).

A spatial excitation module for use with Varian compatible pulse sequences was written in the "C"-like code that is used with VNMR spectrometer software. This module contains software for declaring and fetching as VNMR interactive variables all of the parameters necessary for completely defining a spatial excitation sequence. The spatial excitation module is called via a subroutine defined within VNMR pulse sequence and performs the necessary hardware control calls to execute the spatial excitation pulse sequence. FIG. 7 shows the pulse sequence executed by the spatial excitation modules and highlights the adjustable parameters of the sequence. The magnitude of the selection rephase gradient must be carefully adjusted to remove any residual phase gradient across the slice along the Z-axis as discussed below under the subheading "Calibration Methodology for Simultaneous Phase Cycling NMR" (second paragraph, in particular).

Oscillating Gradient Acquisition Module for VNMR Pulse Sequences

Figure 8:
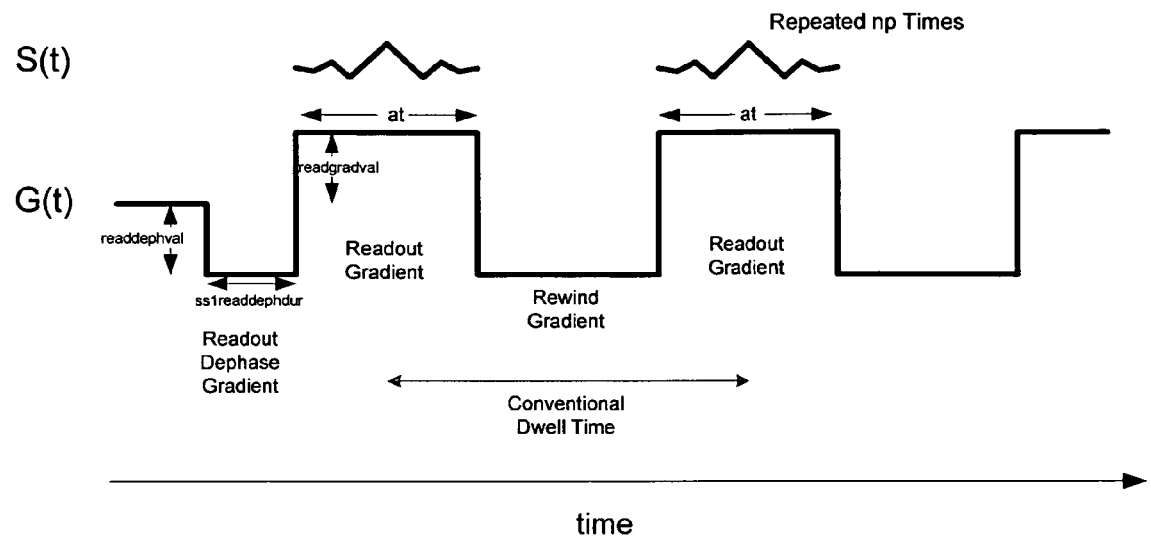
FIG. 8 illustrates the oscillating gradient acquisition used in the present invention. The strength of the readout gradient is determined by the acquisition time and the desired field of view. The gradient pulses are calibrated to center the gradient echo signal within the acquisition window by setting the readout dephase gradient strength (readdephval*sslreaddephdur) equal to half the readout strength (readgradval*at/2). The rewind gradient pulse is equal in area to the readout gradient pulse. The readout-rewind cycle is repeated for each direct dimension sample point.

An oscillating gradient acquisition module for use with Varian compatible pulse sequences was written in "C" code. This module was called via a subroutine within a VNMR pulse sequence and performed the necessary hardware control calls to execute an oscillating gradient acquisition sequence. FIG. 8 shows the pulse sequence executed by the oscillating gradient acquisition module and highlights the adjustable parameters. The magnitude of the readout gradient (readgradval) must be carefully calculated to ensure that the spatial field of view (FOV) corresponds exactly to the excited region of the sample. The magnitude of the readout dephase pulse (readdephval) must be carefully adjusted so that the gradient echo is centered within the acquisition window, as discussed below under the subheading "Calibration Methodology for Simultaneous Phase Cycling NMR" (third paragraph in particular).

Processing of FID Data Collected with an Oscillating Gradient

Processing of data collected with an oscillating gradient requires a low resolution Fourier transform (number of points=number of slices) on each gradient echo. The data must then be separated into independent FIDs which are then treated in a conventional manner as FIDs associated with experiments of different excitation phase. Processing software was implemented using the program Matlab® to read in the VNMR FID data, conduct all of the desired processing of the FID data, and then write out resultant spectrum in NMRPipe (Delaglio et al., "NMRPipe: A Multidimensional Spectral Processing System Based on UNIX Pipes," *J. Biomol.* NMR 6:277-293 (1995), which is hereby incorporated by reference in its entirety) format. Table 3 below lists the processing steps for the data acquired with oscillating gradients. The Fourier transform was performed explicitly by generating sinusoidal reference signals and taking their inner product with the gradient echo data (right column of Table 3). This allowed for oversampling as well as fine adjustment of the position of the time and frequency centers of the transform.

TABLE 3

Oscillating Gradient Acquisition Reconstruction

| Description of Step | Pseudo-Code |
|---|---|
| Read in data from VNMR FID file. | |
| Extract the central data points from each gradient echo to be Fourier transformed to get the spatial profile. | data = echodata(center − nslice/2 * oversamp: center + nslice/2 * oversamp) |
| Generate time array with 0 at the center of the acquisition window plus any desired offset. | time = 1:nslice * oversamp<br>time = time − mean(time)<br>time = time + timeshift |
| Generate array of desired "reference frequencies" for Fourier transformation. Frequencies should be nominally centered around zero but can be offset to accommodate small offsets in spatial profile. | deltafreq = 1/nslice<br>freqarray = 1:nslice * deltafreq<br>freqarray = freqarray − mean(freqarray)<br>freqarray = freqarray + freqoffset |
| Generate reference frequency waveforms. | For each frequency in freqarray<br>ref (i) = exp (j * time * freq) |
| Take the inner product of the reference frequencies with the data to obtain Fourier transformation. | For each freq in freqarray<br>ftOut(i) = innerproduct(ref(i) * data) |
| Re-partition the transformed data into a conventional fid signal for each slice. | |

Calibration Methodology for Simultaneous Phase Cycling NMR

Methodology was developed to calibrate the gradient pulse areas for simultaneous phase cycling NMR studies. Calibration software was developed using the program Matlab®, building upon the basic software for processing of data acquired using oscillating gradients. In general, calibration for simultaneous phase cycling NMR consisted of adjusting gradient power or area (gradient amplitude times time for rectangular shaped pulses) under each pulsed field gradient.

The slice select rephase gradient was calibrated by adjusting the value of ssrephval in FIG. 7. The calibration was required in order to accurately remove the phase gradient across the slice which was accumulated during selective spatial excitation as discussed above in the "Background of the Invention" section. The criteria for accurate calibration of the gradient for slice select rephase is that the desired signal from all slices are maximized by virtue of having no residual phase gradient across the width of the slice. Any residual phase gradient across the width of the slice will result in partial cancellation of signals and will reduce the sensitivity of the NMR experiment. Unfortunately, if different slices are excited with RF pulses with different phases as in simultaneous phase cycling NMR, the signals from the multiple slices cancel, which makes it difficult to find the optimum phase gradient. To avoid this problem, the RF pulse was replaced with an analogous pulse in which the phases of the RF pulses applied on the various slices were set to zero. The calibration was done using this pulse, considering that the calibration would be the same for the desired pulse with several different phases. The sequence for calibration of the slice select rephase gradient is shown in Table 4.

TABLE 4

Slice Select Rephase Gradient Calibration

| Step | Action |
|---|---|
| 1 | Replace multiphase RF pulse with an identical pulse with all zero phases. |
| 2 | Using VNMR, create an array of values for ssrephval ranging from 0.5 to 1.5 over 50 steps. |
| 3 | Run a 1-D experiment over the array of values. |
| 4 | View all the resulting spectrum and select the value of ssrephval that results in the highest signal-to-noise ratio. |

The readout dephase gradient was calibrated by adjusting the value of readdephval in FIG. 8. The purpose of readout dephase gradient calibration is to accurately center the gradient echo within the acquisition window. This is equivalent to ensuring that the phase across the sample in the direction of the gradient is determined entirely by the excitation phase of the slices and the shift evolution. The effect of the gradients used for selective excitation and oscillating gradient acquisition should accurately cancel at the time point defining the middle of the acquisition window. Software for efficient calibration of gradients was written in Matlab® and used to assist with readout dephase gradient calibration. One important aspect of readout dephase gradient calibration is related to precisely defining how a correct calibration can be assessed. The actual echo peak is usually quite broad, and determining the correct calibration by centering this peak in the time domain is difficult to achieve. Thus, a figure of merit (FOM) was defined based on how closely the phase relationships in the spectra of the individual slices spectrum acquired during the calibration sequence match the phase relationships that are expected based on the pulse sequence and the excitation phases for the given slices. An experiment was conducted in which the value for readdephval is stepped through an array of values. The calibration FOM was then calculated for each transient and the readdephval resulting in the best FOM was selected.

Figure 9:
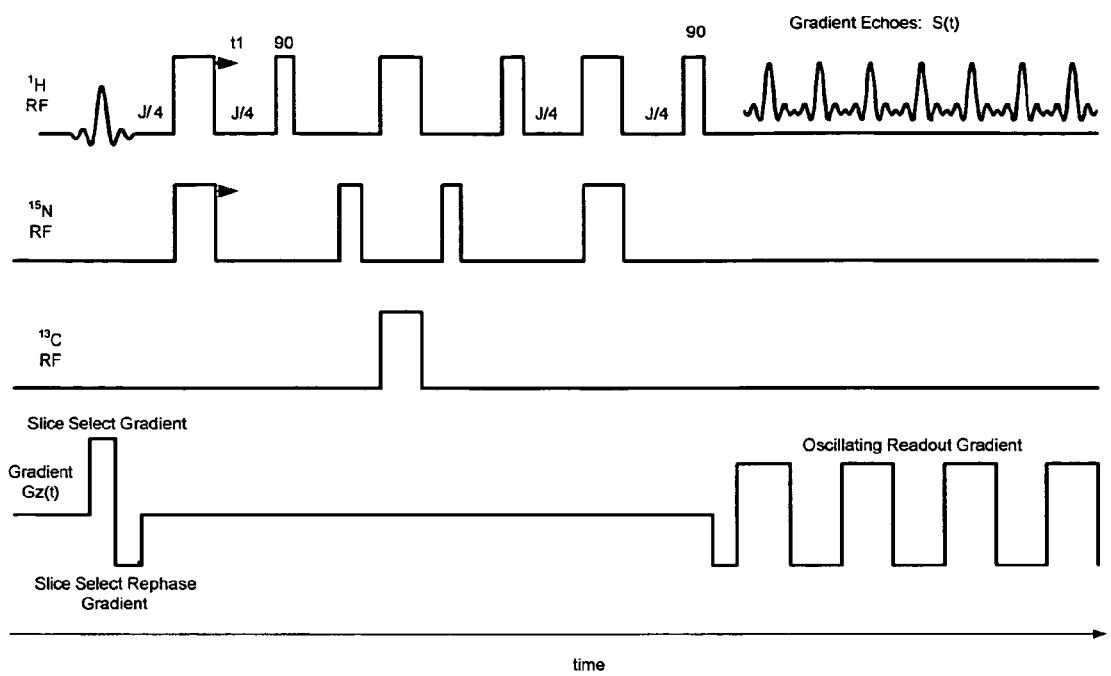
FIG. 9 shows a 2D [$^{15}$N,$^{1}$H] HSQC RF pulse sequence. Thin and thick RF pulses represent 90° excitation pulses and 180° inversion pulses, respectively. All RF pulse phases are 0°, unless otherwise noted. This pulse sequence is designed for testing simultaneous phase cycling and is the same as a standard [$^{15}$N,$^{1}$H] HSQC pulse sequence, except that the first RF pulse on $^{1}$H is spatially selective through use of a shaped RF pulse and a slice select and slice select rephase gradient. In addition, $^{1}$H rather than $^{15}$N chemical shifts evolve in the indirect dimension. A square-pulse oscillating gradient is applied during acquisition to allow spatial decoding of temporally superimposed signals. J represents the one-bond $^{1}$H$^{N}$—$^{15}$N scalar coupling.

Use of Simultaneous Phase Cycling Using a 2D [$^{15}$N, $^{1}$H] HSQC Sequence for Achieving Quadrature Detection in the Indirect Dimension in a Single Transient In order to test selective excitation and separation of simultaneous phase cycling signals, a modified test version of the conventional 2D [$^{15}$N,$^{1}$H] HSQC pulse sequence was developed. In addition to adding spatially selective excitation and oscillating gradient acquisition, the indirect dimension time evolution was moved from $^{15}$N to $^{1}$H. The pulse sequence then became a proton-proton 2D sequence selecting only for signals arising from amide protons (FIG. 9).

Unlike a conventional [$^{15}$N,$^{1}$H] HSQC, where indirect dimension quadrature detection is done using a two step phase cycle on the first 90° pulse on $^{15}$N, indirect dimension quadrature detection on the test sequence was achieved using a 0° and 90° initial RF pulse on $^{1}$H. Signal separation of the simultaneous phase cycling-excited slices using an oscillating acquisition gradient can then be demonstrated by the "effectiveness of quadrature detection" reflected by the extent to which the signal with the correct direction of rotation is preserved while the signal with the opposite rotation, or "quadrature ghost," is suppressed.

FIG. 10A shows the spectrum from one spatially selected slice which contained only signal from the slice which received an excitation pulse having a phase of 0°. The quite comparable amplitudes of the signals in the lower and the upper halves of the spectrum are notable. FIG. 10B shows the same spectrum obtained from 4 planes with phases 0°, 90°, 180°, and 270°. The 0° signal for the quadrature detection was formed from the 0° slice minus the 180° slice. The 90° signal for the quadrature detection was formed from the 90° slice minus the 270° slice. Four slices instead of the required two were used to provide robustness against slice to slice amplitude variation and to aid in calibration. Successful spatial excitation and associated oscillating gradient acquisition was demonstrated by the approximately ten-fold reduction of the opposite sign indirect dimension signal, i.e., quadrature ghost, after reconstruction. Hence, simultaneous phase cycling NMR was successfully employed for achieving quadrature detection in the indirect dimension in a single transient.

Figure 11:
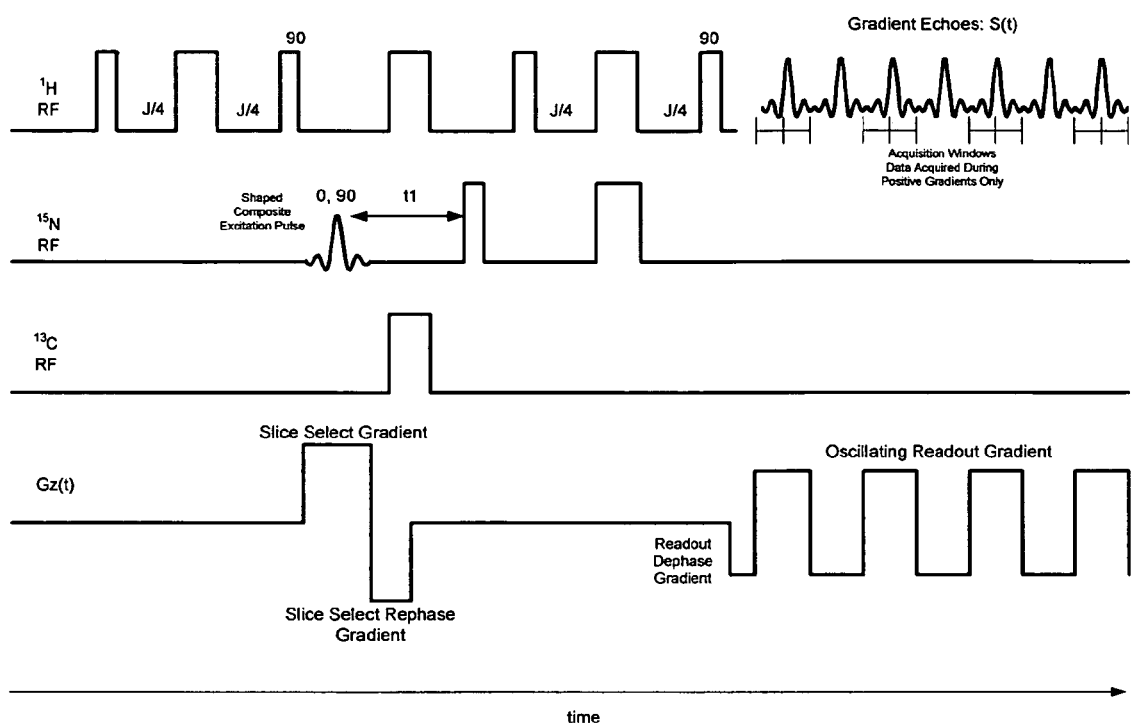
FIG. 11 depicts a [$^{15}$N, $^{1}$H]-HSQC pulse sequence with simultaneous phase cycling applied for quadrature detection along t1($^{15}$N). Narrow and wide pulses represent 90° and 180° RF pulses, respectively. Phases are 0 unless otherwise noted. The first pulse on $^{15}$N is part of a spatial excitation module including shaped pulse and selection gradient (FIG. 7), and the acquisition includes a train of gradient echoes (FIG. 8).

FIG. 11 shows the pulse sequence for a [$^{15}$N,$^{1}$H] HSQC experiment, including spatial excitation and oscillating gradient acquisition for simultaneous phase cycling spectroscopy. Thin and wide bars represent 90° and 180° RF pulses, respectively.

Slice select gradient calibration for 2D [$^{15}$N, $^{1}$H] HSQC was performed as described above under the subheading "Calibration Methodology for Simultaneous Phase Cycling NMR" (second paragraph in particular). Readout dephase gradient calibration was performed as described above under the subheading "Calibration Methodology for Simultaneous Phase Cycling NMR" (third paragraph in particular).

Correct implementation of the pulse sequence shown in FIG. 11 was verified by displaying the sequence in VNMR and checking timing, phases, and power levels. The pulse sequence modifications for simultaneous phase cycling were implemented in a modular manner with software flags to enable and disable them. The pulse sequence was then optimized as shown in Table 5.

TABLE 5

Sequence for Optimizing Simultaneous Phase
Cycling [15N,H]-HSQC NMR Spectroscopy

| Step | Action |
|---|---|
| 1 | Set flags for conventional sequence, adjust pulse powers and receiver gain. |
| 2 | Enable shaped pulse with all slice phases 0, adjust shaped pulse RF power for maximum received signal. |
| 3 | Enable selection gradient, adjust for desired selection region width, calibrate the slice select rephrase gradient for maximum signal. |
| 4 | Enable oscillating acquisition gradient, adjust acquisition time for desired direct dimension |

TABLE 5-continued

Sequence for Optimizing Simultaneous Phase
Cycling [15N,H]-HSQC NMR Spectroscopy

| Step | Action |
|---|---|
|  | spectral width. |
| 5 | Adjust readout gradient strength for desired field of view. |
| 6 | Calibrate the readout dephase gradient using the designed FOM. |
| 7 | Adjust selection gradient strength and field of view as necessary to maximize calibration FOM |
| 8 | Switch to the shaped RF pulse containing slices with phases 0°, 90°, 180°, and 270°. |
| 9 | Acquire data for 2D NMR experiment. |
| 10 | Process and analyze quadrature detection performance by measuring the ratio of desired peaks to "quadrature ghost" peaks. |

Example 2

Use of Simultaneous Phase Cycling for Single Transient Homonuclear Coherence Selection A COSY RF pulse sequence uses two 90° RF pulses with an incremented evolution period in between them in order to produce a two dimensional spectrum with a diagonal peak for each atomic nuclei in the sample and a cross peak whenever two nuclei are scalarly coupled. Unfortunately, cross and diagonal peaks in COSY are 90° out of phase, so the broad, dispersive diagonal signal often obstructs viewing of nearby cross peaks. In a DQF COSY pulse sequence, a third RF pulse is added which, in conjunction with double-quantum filtration, results in diagonal and cross peaks with the same phase. A four step phase cycling scheme is usually used for DQF COSY.

Simultaneous phase cycling was applied to a DQF COSY pulse sequence in order to enable simultaneous execution of the required four phase cycling steps.

Figure 12:
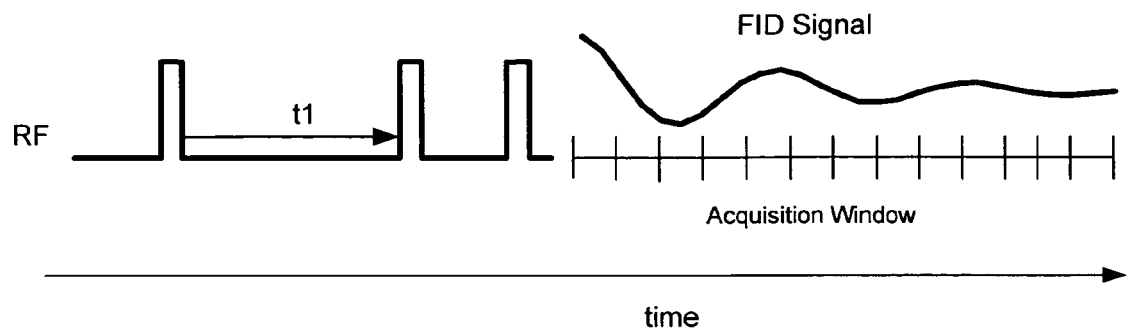
FIG. 12 depicts a conventional DQF COSY pulse sequence. All three pulses are 90° pulses. The incremented indirect dimension evolution time is denoted t1. RF pulse phases are as shown in Table 6.

FIG. 12 shows the conventional sequence for executing a homonuclear DQF COSY, and Table 6 shows the phase cycle for double-quantum filtration. The first five columns in Table 6 show the pulse and receiver phases used conventionally. The phases of pulse 1 (P1) and pulse 2 (P2) are rotated by 90° each cycle and the receiver phase (Rx) is shifted at twice the rate. The absolute phase of each row is arbitrary; only the relative phases of the pulses and receiver determine which coherence transfer pathways are selected. Rotation of each row by the phase shown in column 6 (ΔP) results in the phase cycle used for simultaneous phase cycling DQF COSY, which is shown in the last four columns.

TABLE 6

Phase Cycling for DQF COSY

| | Conventional Phase Cycle | | | | | Simultaneous Phase Cycling Phase Cycle | | | |
|---|---|---|---|---|---|---|---|---|---|
| Cycle | P1 | P2 | P3 | Rx | ΔP | P1 | P2 | P3 | Rx |
| 1 | 0° | 0° | 0° | 0° | 0° | 0° | 0° | 0° | 0° |
| 2 | 90° | 90° | 0° | 180° | −90° | 0° | 0° | 270° | 90° |
| 3 | 180° | 180° | 0° | 0° | −180° | 0° | 0° | 180° | 180° |
| 4 | 270° | 270° | 0° | 180° | −270° | 0° | 0° | 90° | 270° |

Figure 13:
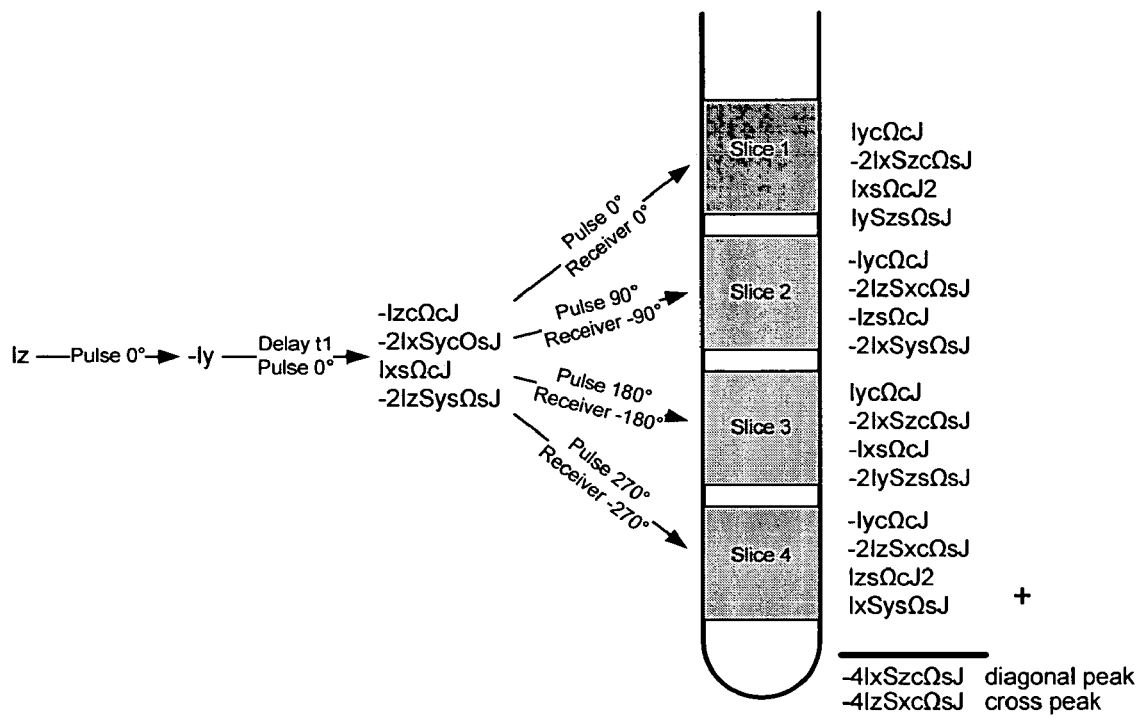
FIG. 13 demonstrates how simultaneous phase cycling is used to acquire a DQF COSY spectrum. The four step phase cycle for double quantum filtration is shown, using an abbreviated product operator notation. A spin system consisting of two spins denoted I and S, which have chemical shifts denoted $\Omega I$ and $\Omega S$, respectively, and are coupled by a scalar coupling denoted $J_{IS}$, is assumed. The abbreviations used are: $c\Omega=\cos(\Omega_I*t1)$, $s\Omega=\sin(\Omega_I*t1)$, $cJ=\cos(J_{IS}*t1)$, and $sJ=\sin(J_{IS}*t1)$. The three 90° flip angle pulses and their phases are shown as, for example, "pulse 0°." The initial magnetization is assumed to be Iz as shown at the far left of the diagram. The first RF pulse converts this magnetization to −Iy. The terms resulting from chemical shift and scalar coupling evolution over the indirect dimension time delay t1, followed by the second RF pulse are shown next. Then, the product operator terms that result from the chosen phase cycling scheme (0°, 90°, 180°, and 270°) along with their associated receiver phases (0°, −90°, −180°, and −270°) are shown. In a conventional DQF COSY, these four steps are executed in four sequential transients. In the simultaneous phase cycling DQF COSY depicted here, these four steps are simultaneously applied to four discrete "slices" of the NMR sample. Finally, the bottom of the diagram shows the surviving terms after the results of the four phase cycles have been summed together.

The phase cycling scheme for DQF COSY is shown in FIG. 13. Variations of this scheme exist, but they are "net rotations" of this scheme. As can be seen by careful inspection of the rightmost column, all four cycles are required to completely cancel undesired signals.

Figure 14:
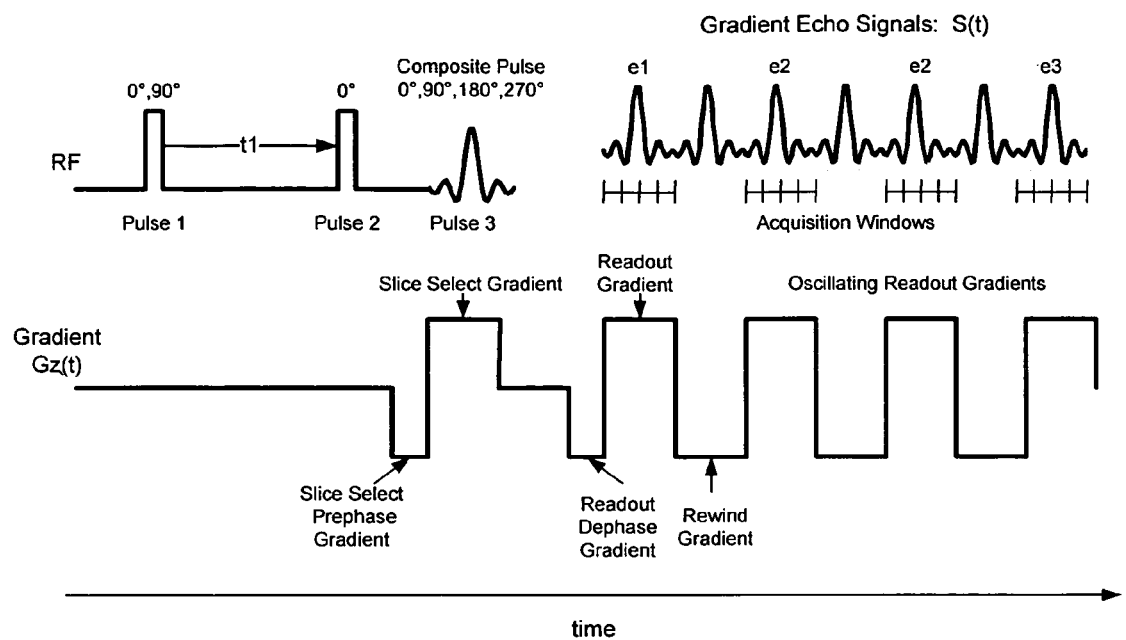
FIG. 14 depicts a simultaneous phase cycling DQF COSY pulse sequence. RF Pulses 1 and 2 are non-selective 90° flip angle pulses as in a conventional DQF COSY pulse sequence. Pulse 1 is phase cycled 0° and 90° to provide phase sensitive detection in the indirect dimension. The indirect chemical shift evolution period, t1, is stepped in sequential experiments from 0 to the t1$_{max}$. RF Pulse 2 is a non-selective pulse of phase 0°. RF Pulse 3 is a selective, composite pulse which is applied in conjunction with a field gradient along Z to selectively excite four discrete slices with phases 0°, 90°, 180°, and 270°. The gradient waveform effectively implements a "prephase" and a "selection gradient." The selection gradient is applied during the composite RF pulse and translates the spectral profile of the RF pulse into a spatial excitation profile. The "prephase" gradient imparts a phase gradient along Z for magnetization being transverse after the second RF pulse. This phase gradient is then "unwound" by the off-resonance effects of the selective third RF pulse. An oscillating gradient is applied during the acquisition period. A "readout dephase" gradient imparts an initial "Z" dimension linear phase gradient to transverse magnetization. A repeating sequence of "readout" and "rewind" gradients generates a train of "gradient echo" signals which peak as the phase gradient slope approaches zero in the middle of each gradient. Because of hardware limitations regarding the number of gradient echoes that can be acquired, only signals from odd numbered gradients are used. In principle, however, both the odd and even gradient echo signals could be used, if one of them were reversed in time relative to the other. The spectrum from the two sets of signals (odd- and even-numbered echoes) could then be added to increase the signal-to-noise ratio.

FIG. 14 shows the RF pulse and pulsed field gradient sequence for simultaneous phase cycling DQF COSY. The composite selective RF Pulse 3, in conjunction with a gradient along the Z-axis, excites four slices of the sample with phases 0°, 90°, 180°, and 270°, as is required to implement double quantum filtration (FIG. 13). The oscillating gradients during acquisition allow separation of the signals from the four slices at each of the direct dimension sample points. FIG. 15A shows the temporal shape of the composite RF pulse which is the summation of four frequency shifted "sinc" pulses appodized with a Hamming window to reduce artifacts (Bernstein et al., *Handbook of MRI Pulse Sequences*, Academic Press, San Diego (2004), which is hereby incorporated by reference in its entirety). FIG. 15B shows a simulation of the resulting spatial profile.

Selective excitation was performed by application of a gradient concurrent with a shaped RF pulse. The RF pulse spectral width was chosen based on the RF power and maximum gradient strength. Specifically, the shaped RF pulse was 123 μsecs long, and each spectral lobe of the composite pulse had a spectral width of 24.39 kHz. The gradient strength was then determined by $$G = SW/(Gamma*Thickness)$$

where G is the required gradient strength in Gauss/cm, SW is the spectral width of each lobe of the RF pulse in Hz, Gamma is the gyromagnetic ratio of the species being excited (4257 Hz/Gauss for protons), and Thickness is the desired thickness of the selected region of the sample associated with each spectral lobe of the composite RF pulse. Specifically, SW was set to 24.39 kHz, the thickness was set to 0.175 cm, and the associated selection gradient strength was set to 32.74 Gauss/cm.

The readout gradient must be at least strong enough to allow acquisition of the entire gradient echo with desired spatial resolution within the time allotted to each sampling or "dwell" time of the direct dimension data acquisition. This available dwell time is determined by the desired direct dimension data acquisition spectral width. Specifically, the dwell time was 139 μs. Acquiring a gradient echo with sufficient resolution during this time would require a readout gradient strength of 4.04 Gauss/cm. However, in practice, the readout gradient is made stronger in order to minimize the impact of magnetic field inhomogeneity. The required sampling rate for each gradient echo was then determined by SRATE=G*Gamma*W, where G is the chosen readout gradient strength in Gauss/cm, Gamma is the gyromagnetic ratio of the nucleus being detected (e.g., 4257 Hz/Gauss for protons), and W is the spatial width of the excited region of the sample in cm. Specifically, G was chosen as 17.53 Gauss/cm and W was 0.8375 cm, resulting in a spectral width for the acquired signal of 62.5 kHz. Since sampling must be done at twice this frequency, the corresponding sampling rate during signal detection was 125 kHz.

The application of the selective excitation results in a linear phase gradient of the excited spins across the length of the sample. This phase gradient can be removed by application of an additional gradient of opposite sign to the selection gradient. This additional pulse can be applied after ("rephase") or before ("prephase") the selective excitation, depending on the population of spins one wants to rephase, as is well known in the art of "gradient selection" for NMR. The "rephase" pulse should have an area (pulse width times magnitude) of 2/pi times the area of the selection gradient and can be used to rephase spins that are transverse after the selection pulse.

In the case of simultaneous phase cycling implemented for DQF COSY, the desired spins are already transverse prior to the spatially selective pulse, so the "rephase" pulse may be replaced by a "prephase" pulse which is applied prior to the selection pulse. Additionally, the "readout dephase pulse" may be moved prior to the selection gradient and combined with the "selection prephase" pulse to produce a single combined calibration pulse. Specifically, the combined calibration pulse was empirically adjusted to maximize the desired signal. The empirically adjusted combined calibration pulse had a duration of 25 μs and an amplitude of 8.05 Gauss/cm.

Figure 16:
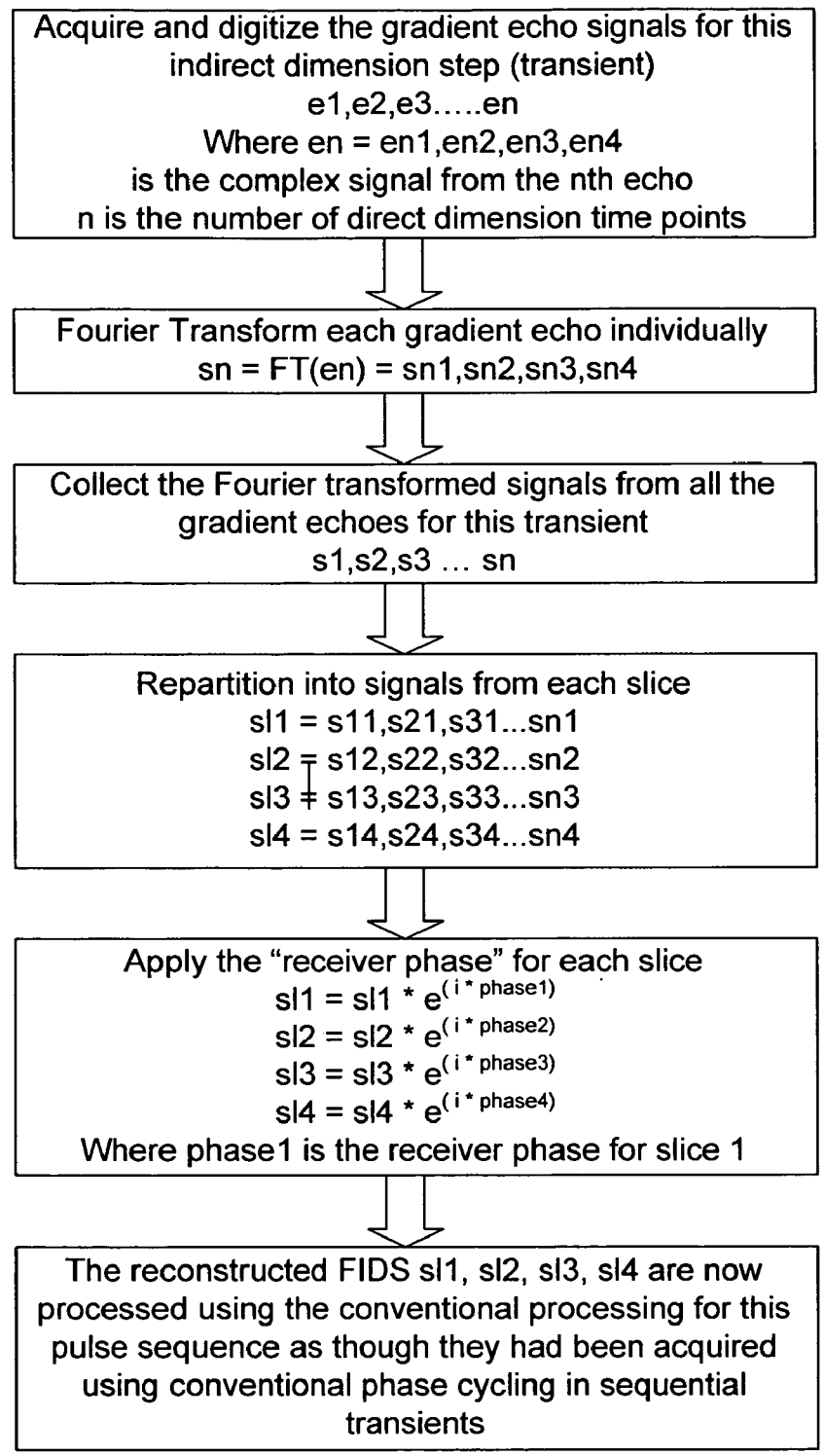
FIG. 16 is a flow chart for acquisition and processing of NMR data acquired with simultaneous phase cycling. The complex data for the odd numbered gradient induced echoes are acquired and digitized. The number of sample points acquired for each echo must be at least as large as the number of simultaneous phase cycling steps. A Fourier transform is performed individually on the signal from each gradient echo acquired. The data are repartitioned to form FIDs for each simultaneous phase cycling slice. The required receiver phase is applied to each slice signal. The resultant FIDs are then processed the same way as conventional phase cycle signals. The data are appodized with sine-bell window functions and Fourier transformed in both the direct and indirect dimensions.

FIG. 16 shows a flow chart for processing the simultaneous phase cycling NMR data. The data from each gradient echo was Fourier transformed to separate the signals from each of the four slices. The resultant data was multiplied by the desired "receiver phase" for each cycle and then processed using conventional NMR data processing.

Figure 17:
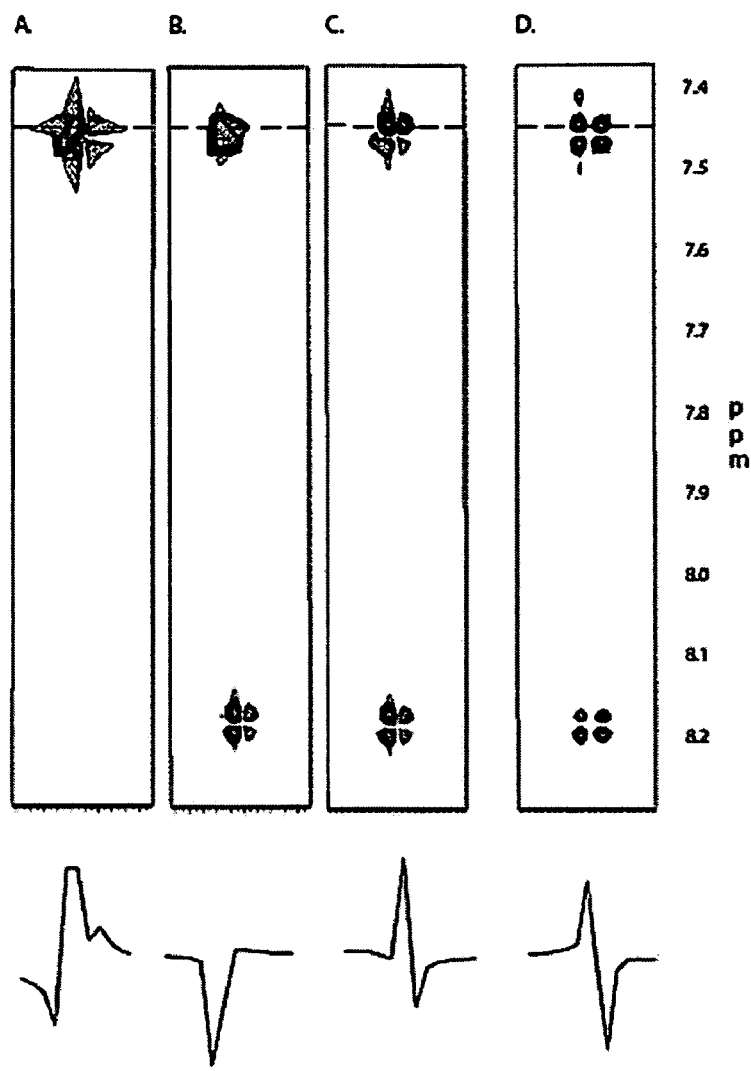
FIG. 17 shows strips from the aromatic region of spectra from conventional and simultaneous phase cycling DQF COSY experiments conducted on a sample of 4-methoxy-3-nitrobenzoic acid (see FIG. 18). Strip A shows the spectrum resulting from the first phase cycle step of a conventional acquisition which has RF pulse phases of 0°, 0°, and 0° and a receiver phase of 0°, as shown in FIG. 13. The upper peak is from the diagonal and contains a combination of double quantum filtered and single quantum terms which results in a complex multi-shaped peak. Strip B shows the spectrum from the second phase cycle step. The lower cross peak manifests the coupling between spins with chemical shifts at approximately 7.4 and 8.2 ppm. The DQF cross peak shows a quartet structure due to mutual splitting. Strip C shows the result of summing the spectrum from the four step phase cycle shown in FIG. 13. Other signals were eliminated by the double-quantum filtration, leaving nearly identical DQF quartets in both the diagonal and cross-peak positions. Strip D shows the single transient spectrum from the simultaneous phase cycling DQF COSY pulse sequence shown in FIG. 14 reconstructed as outlined in FIG. 16. The DQF signals for both the diagonal and cross peaks are present, showing that the four phase cycles from the DQF COSY sequence have been implemented in a single transient through spatial excitation and acquisition.
Figure 18:
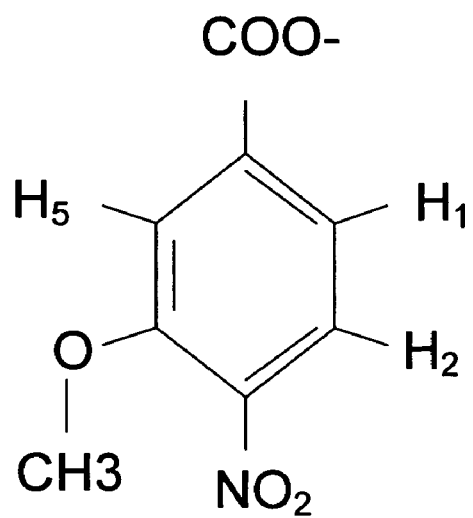
FIG. 18 shows the chemical structure of 4-methoxy-3-nitrobenzoic acid, the sample used for the experiment described in Example 2 of the present application. Spectral peaks shown in FIG. 17 are from the proton labeled $H_2$. The sample was dissolved in deuterated dimethyl sulfoxide (DMSO) and was approximately 1 M in concentration.

FIG. 17 shows strips taken from the aromatic region of a spectrum from DQF COSY experiments conducted on a sample of 4-methoxy-3-nitrobenzoic acid (see FIG. 18), which includes a pair of scalarly coupled spins. Strips A and B show spectrum from two individual phase cycles of a conventional four phase cycle DQF COSY experiment. Each individual cycle resulted in combinations of double quantum and single quantum signals. Strip C shows the spectrum resulting from summing the four phase cycles of the conventional study, revealing double quantum filtered signals in both the diagonal and cross-peak positions and cancellation of undesired single quantum signals. Strip D shows a similar result from a single transient simultaneous phase cycling DQF COSY experiment.

In sum, simultaneous acquisition of the four step RF phase cycle was performed for implementing DQF COSY. A composite selective RF pulse was applied in concert with a field gradient to excite multiple spatial regions of the sample (slices), each with a different phase. An oscillating gradient was applied during signal acquisition and a Fourier transform was applied to the resulting gradient echoes in order to separate the signals from the individual excited slices. Separated slice data was then processed as conventional phase cycle data to produce the double quantum filtered spectrum. The result was acquisition of a conventional four phase cycle spectrum in a single transient, where the study duration was reduced by a factor of four.

Example 3

Use of Simultaneous Phase Cycling for Acquisition of G-Matrix Fourier Transform (GFT) NMR Simultaneous phase cycling was used to acquire a (3,2)D HC(C)H, providing FIDs from a single transient which need to be linearly combined to yield basic and central peak sub-spectra.

GFT Pulse Sequence with Simultaneous Phase Cycling

Figure 19:
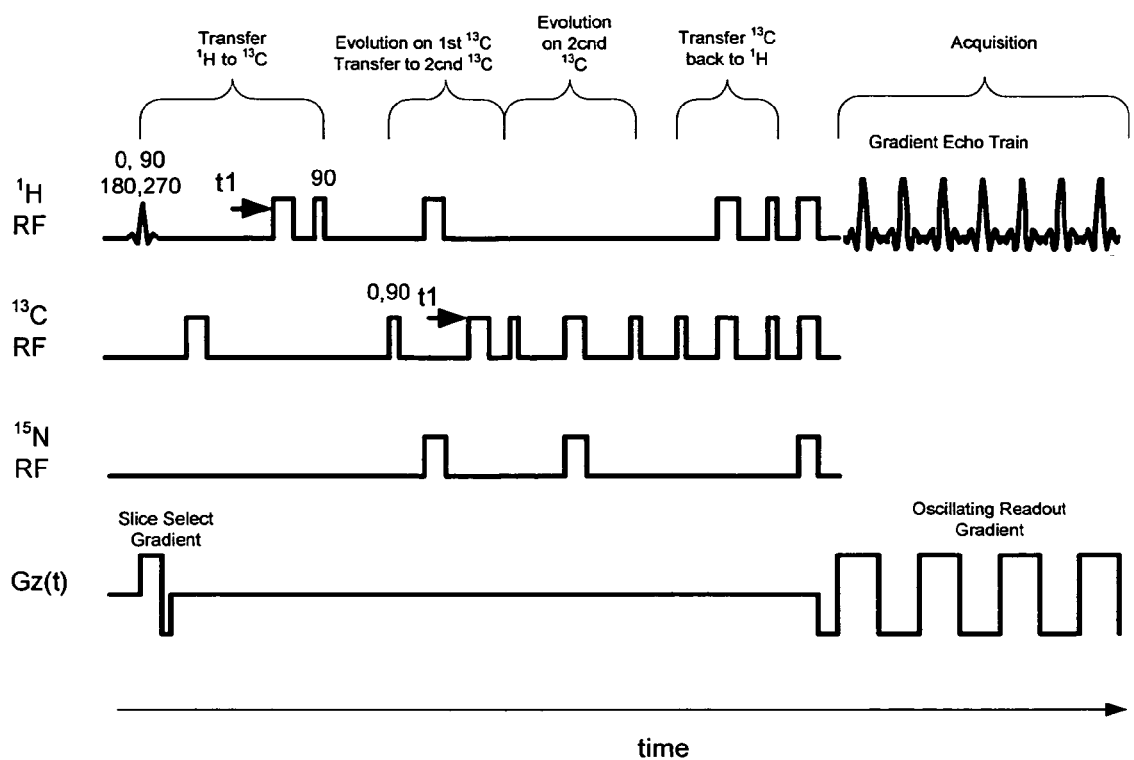
FIG. 19 depicts the simultaneous phase cycling GFT (4,3)D HCCH pulse sequence. This pulse sequence consists of four modules as described at the top of the figure. The co-evolution of first $^1H$ and first $^{13}C$ occur during t1. The simultaneous phase cycling sequence has a four slice spatial excitation on the first $^1H$ pulse. Oscillating gradient acquisition is used to allow separation of the four slice signals via Fourier transform. RF pulses on $^{15}N$ serve to decouple $^1J_{CN}$ scalar couplings.

A complete pulse sequence for conducting simultaneous phase cycling GFT NMR was developed in the "C" like VNMR pulse sequence language by incorporating the already developed selective excitation and oscillating gradient acquisition modules into a GFT (3,2)D HC(C)H COSY pulse sequence. The simultaneous phase cycling version of the pulse sequence is shown in FIG. 19. The phase cycles performed in the conventional experiment are shown in Table 7. (A signal name is included to guide the understanding of the associated data processing.)

TABLE 7

Phase Cycles for GFT (3, 2)D HC(C)H COSY

| Cycle | Signal Name | Phase on First Proton 90° Pulse | Phase on First Carbon 90° Pulse | Receiver Phase |
|---|---|---|---|---|
| 1 | coscos | 0° | 0° | 0° |
| 2 | cossin | 0° | 90° | 0° |
| 3 | sincos | 90° | 0° | 90° |
| 4 | sinsin | 90° | 90° | 90° |
| 5 | -coscos | 180° | 0° | 0° |
| 6 | -cossin | 180° | 90° | 0° |
| 7 | -sincos | 270° | 0° | 90° |
| 8 | -sinsin | 270° | 90° | 90° |

Peak separation in GFT studies involves forming linear combinations of the sub-spectrum listed in Table 7 (U.S. Pat. No. 6,831,459 to Szyperski et al., which is hereby incorporated by reference in its entirety). The signal combinations formed during processing have been described in U.S. Pat. No. 6,831,459 to Szyperski et al.; Kim et al., "GFT NMR, A New Approach to Rapidly Obtain Precise High-Dimensional NMR Spectral Information," J. Am. Chem. Soc. 125:1385-1393 (2003), which are hereby incorporated by reference in their entirety.

Software for Processing of Simultaneous Phase Cycling GFT NMR Spectra

Software for processing of simultaneous phase cycling GFT NMR data was developed in MATLAB®.

Peak discrimination was quantified using MATLAB® and measuring the ratio of desired peaks to undesired (artifact) peaks for each reconstruction.

Calibration Protocol for Simultaneous Phase Cycling GFT NMR Pulse Sequence

Pulse sequence calibration for a simultaneous phase cycling GFT NMR pulse sequence involves tuning various timing and gradient parameters to enable correct separation of the signal arising from the different spatially selected slices. The calibrations to be performed include, in the following order, zero order phase calibration, slice select rephase gradient calibration, and readout dephase calibration.

Slice select rephase gradient calibration for the GFT NMR study is performed as described above in Example 1 under the subheading "Calibration Methodology for Simultaneous Phase Cycling NMR" (second paragraph in particular).

After the slice select rephase gradient is calibrated, the readout dephase gradient is calibrated to ensure the correct phases for the spatially separated slices. In theory, the 0° and 180° slices of the four slice excitation should produce maximum signals that are opposite in phase. The 90° and 270° slices should result in no signal for zero evolution time in the indirect dimension. Since the slices were excited in order (slice 1=0°, slice 2=90°, slice 3=180°, slice 4=270°), an FOM for calibration of this pulse sequence is:

FOM=Desired signal/Undesired signal where

Desired signal=abs((slice 1 signal)+(slice 3 signal)*exp(j*pi))

and

Undesired signal=abs(slice 2 signal)+abs(slice 4 signal).

As described above in Example 1 under the subheading "Calibration Methodology for Simultaneous Phase Cycling NMR" (third paragraph in particular), a set of experiments was conducted for different values of readdephval and the value corresponding to the maximum FOM was selected.

Although the invention has been described in detail, for the purpose of illustration, it is understood that such detail is for that purpose and variations can be made therein by those skilled in the art without departing from the spirit and scope of the invention which is defined by the following claims.

What is claimed is:

1. A method of simultaneously conducting more than one step of a radiofrequency phase cycle in a nuclear magnetic resonance (NMR) experiment, said method comprising:
   providing a sample;
   applying one or more radiofrequency pulses to a plurality of spatially discrete slices of the sample under conditions effective to simultaneously conduct more than one step of a radiofrequency phase cycle in a single transient;
   acquiring NMR signals generated from said applying; and
   processing the NMR signals to obtain an NMR spectrum.

2. The method according to claim 1, wherein said applying comprises applying one or more composite radiofrequency pulses simultaneously with a pulsed magnetic field gradient to the sample under conditions effective to simultaneously excite the plurality of spatially discrete slices of the sample, each of the plurality of spatially discrete slices being excited with an independent excitation phase.

3. The method according to claim 2, wherein said composite radiofrequency pulse is a sum of multiple frequency shifted sinc (sin(t)/t) shaped pulses.

4. The method according to claim 2, wherein said applying comprises selecting the independent excitation phases of the composite radiofrequency pulse such that the acquired signal is a sum of signals from the plurality of spatially discrete slices of the sample.

5. The method according to claim 1, wherein, during said acquiring, an oscillating pulsed magnetic field gradient is applied to the sample under conditions effective to generate a train of gradient echoes and enable separation of signals from the plurality of spatially discrete slices of the sample.

6. The method according to claim 5, wherein each of the gradient echoes is Fourier transformed to separate signals from the plurality of spatially discrete slices of the sample, each corresponding to an independent excitation phase.

7. The method according to claim 1, wherein said method is used to achieve quadrature detection in the indirect dimension of a multidimensional NMR experiment in a single transient.

8. The method according to claim 1, wherein said method is used to achieve coherence selection in a multidimensional NMR experiment in a single transient.

9. The method according to claim 8, wherein coherence selection is used for obtaining multiple-quantum filtered correlation spectrum.

10. The method according to claim 8, wherein coherence selection is used for obtaining multiple-quantum correlation spectrum.

11. The method according to claim 8, wherein coherence selection is used for obtaining heteronuclear correlation spectrum.

12. The method according to claim 1, wherein said method is used to obtain sub-spectra in a G-matrix Fourier transformation (GFT) NMR experiment from a single transient, wherein said GFT NMR experiment comprises jointly sampling chemical shift evolution periods spanning a given subspace of a Fourier transformation multidimensional NMR experiment.

13. The method according to claim 1, wherein said method is used to suppress spectral artifacts.

14. The method according to claim 13, wherein the spectral artifacts arise from incomplete suppression of NMR signals of a solvent in the sample.

15. The method according to claim 13, wherein the spectral artifacts arise from NMR polarization giving rise to axial peaks.

* * * * *